United States Patent [19]

Aoki et al.

[11] Patent Number: 5,764,842

[45] Date of Patent: Jun. 9, 1998

[54] SEMICONDUCTOR GUIDED-WAVE OPTICAL DEVICE AND METHOD OF FABRICATING THEREOF

[75] Inventors: Masahiro Aoki; Hiroshi Sato; Makoto Suzuki; Masaaki Komori, all of Kokubunji, Japan

[73] Assignee: Hitachi, Ltd., Tokyo, Japan

[21] Appl. No.: 619,184

[22] Filed: Mar. 21, 1996

[30] Foreign Application Priority Data

Mar. 23, 1995 [JP] Japan ................................. 7-063720
Oct. 20, 1995 [JP] Japan ................................. 7-272319

[51] Int. Cl.$^6$ ................................................. G02B 6/10
[52] U.S. Cl. ........................... 385/131; 385/1; 385/8; 385/123; 385/129; 430/5; 430/311; 257/18; 257/94
[58] Field of Search ........................... 385/131, 1, 2, 385/8, 4, 123, 129–132, 141–145; 430/5, 311; 257/13, 18, 94, 96

[56] References Cited

U.S. PATENT DOCUMENTS

| 5,598,501 | 1/1997 | Maruo et al. ............ 385/131 X |
| 5,608,566 | 3/1997 | Dutta et al. ............ 385/131 X |

FOREIGN PATENT DOCUMENTS 5-327111  12/1993  Japan .

OTHER PUBLICATIONS

H. Kobayashi et al, "Tapered Thickness MQW Waveguide BH MQW Lasers", Institute of Electronics, Information and Communication Engineers, Spring Conference, 1995, pp. 463–464. No month.

G. Coudenys et al, "Atmospheric and Low Pressure Shadow Masked MOVPE Growth of InGaAs(P)/InP and (In)GaAs/(Al)GaAs Heterostructures and Quantum Wells", Journal of Electronic Materials, vol. 23, No. 2, 1994, pp. 225–232. No month.

S.M. Bedair et al, "New Laterally Selective Growth Technique By Metalorganic Chemical Vapor Deposition", Applied Physics Letters, vol. 48, No. 1, Jan. 6, 1986, pp. 30–32.

H. Kobayashi et al, "Narrow Beam Tapered Thickness Waveguide Integrated BH MQW Laser Operation at High Temperatures", IEEE International Semiconductor Laser Conference, Technical Digest 14, Sep. 1994, pp. 191–192.

G. Vermeire et al, "Monolithic Integration of a Single Quantum Well Laser Diode and a Mode–Size Convertor Using Shadow–Masked Metalorganic Vapour Phase Epitaxial Growth", Journal of Crystal Growth 145, 1994, pp. 875–880.

*Primary Examiner*—Phan T. H. Palmer
*Attorney, Agent, or Firm*—Fay, Sharpe, Beall, Fagan, Minnich & McKee

[57] ABSTRACT

After a shadow mask that is separate from a semiconductor substrate is used and is arranged over the semiconductor substrate via a wafer holder installed in a reaction chamber of a vapor-phase epitaxial system so that a predetermined space d can be secured, a semiconductor thin film crystal including a core layer and a cladding layer is grown by organometallic vapor-phase epitaxy. A core layer wherein the thickness of a grown film in an area which is opposite to a masking part of the shadow mask on the semiconductor substrate is reduced in the tapered shape can be readily obtained by introducing this process for growth in a normal process for fabricating a semiconductor guided-wave optical device. A semiconductor guided-wave optical device and a method of fabricating thereof wherein the thickness of a film which is to be a waveguide is tapered and the width of the waveguide is tapered without deteriorating crystallinity by a new crystal growing method using this shadow mask are obtained. It is desirable that the surface of the shadow mask be coated with a dielectric cap layer. Hereby, a beam expander-integrated laser diode which can be fabricated by an extremely simple method and enables extremely efficient optical coupling with a fiber can be realized.

15 Claims, 24 Drawing Sheets

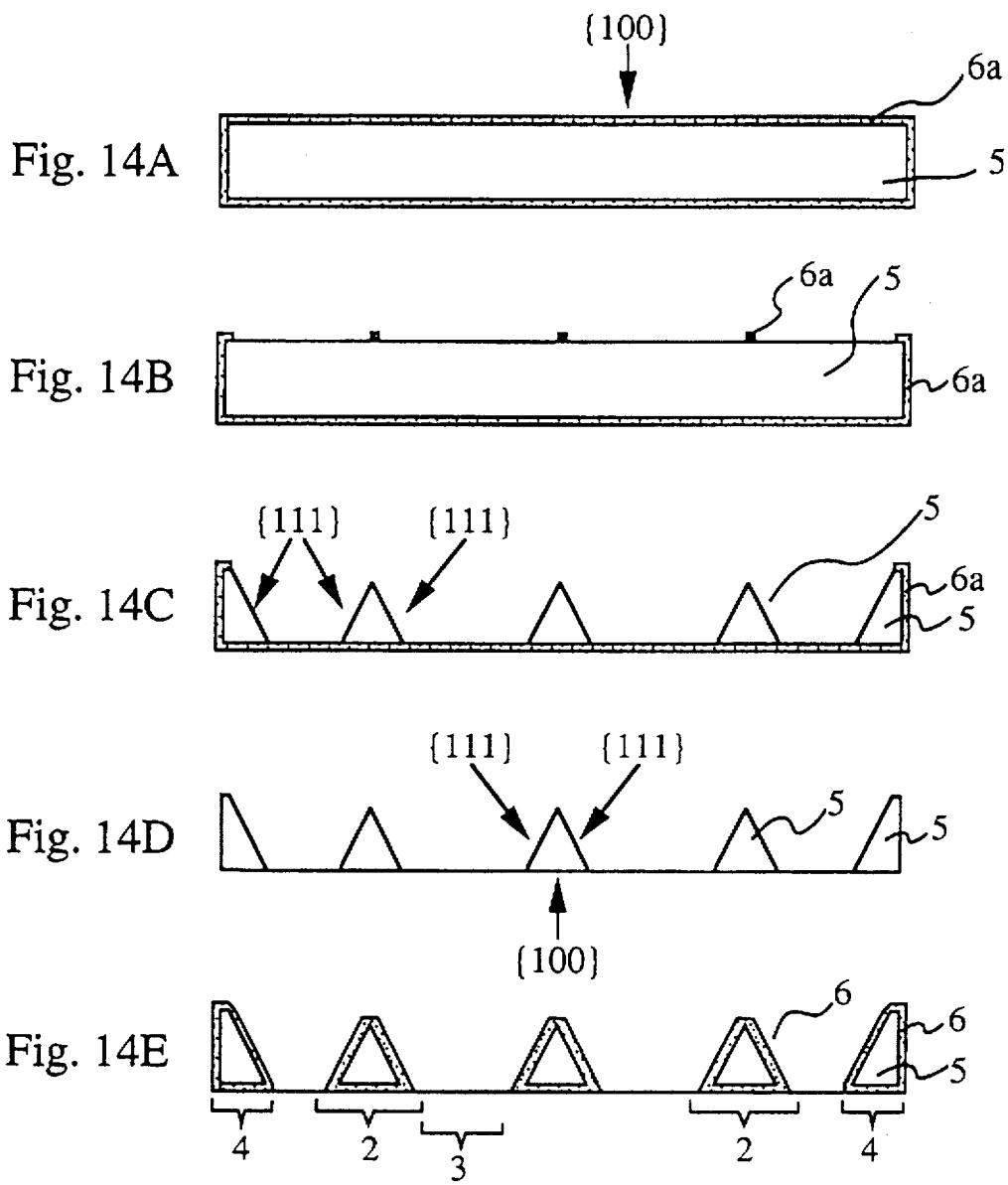

SEMICONDUCTOR GUIDED-WAVE OPTICAL DEVICE AND METHOD OF FABRICATING THEREOF

BACKGROUND OF THE INVENTION

The present invention relates to a semiconductor guided-wave optical device and a method of fabrication therefor, and particularly relates to a semiconductor guided-wave optical device and a method of fabrication therefor suitable for a module for optical fiber communication, an optical communication system and an optical network.

1. A method of fabricating a conventional semiconductor guided-wave optical device If the thickness of a compound semiconductor thin film can be changed on the same surface of a substrate and the tapered distribution of the thickness of a film formed on the same surface can be obtained, it is expected that any of a variety of semiconductor guided-wave optical devices will be able to be priced low and will be provided with high reliability and many functions. A semiconductor guided-wave optical device for optical fiber communication; a semiconductor laser device, the wavelength of light emission form which is 1 µm or less; and a light amplifier can be given as examples. For example, the following effect can be expected by tapering the distribution of the thickness of an active layer (also called core) for emitting a laser beam in a semiconductor laser device for optical fiber communication: The thickness of a well (tub) layer and a barrier layer constituting an active layer, the thickness of which is changed in the tapered shape along the optical axis (that is, in the direction approximately perpendicular to the end face from which a laser beam is emitted) of a laser device, can be also changed continuously. Therefore, as a wavelength in a band gap can be also ultimately changed continuously, a semiconductor laser device having a large gain bandwidth at the oscillation wavelength can be realized.

However, the manufacturing process of a semiconductor guided-wave optical device has a tendency to be complicated by introduction of a film thickness modulation technique for changing the in-plane film thickness distribution. To obtain a tapered semiconductor thin film with high crystallinity in a relatively simple process, it is desirable to modulate the thickness of a film when the film is grown. Generally, vapor-phase epitaxy, in which diffusion of material for growth in the direction parallel to the surface of a substrate in a vapor phase is utilized, is used to obtain the tapered film thickness distribution. For example, for a film thickness modulation technique using metal organic vapor-phase epitaxy (MOVPE), the following three types of vapor-phase epitaxy can be given:

(a) Selective area growth: selective area growth utilizing an increase in the velocity of growth in the vicinity of a dielectric thin film mask close to a substrate. This growth is disclosed in, for example, Japanese published unexamined patent application No. Hei 5-327111 and in SC-4-4 at the Spring Conference held in 1995 of the Institute of Electronics, Information and Communication Engineers. In selective area growth disclosed in Japanese patent Laid-Open No. Hei 5-327111, an oxide silicon film is formed along the optical axis in an active layer formation scheduled area. The oxide silicon film is formed so that the width is changed along the optical axis. As an atom deposited on the oxide silicon film is drifted into an active layer formation scheduled area in vapor-phase epitaxy of an active layer, a thick film is grown because the larger the width of the oxide silicon film, the more atoms are supplied into the active layer formation scheduled area.

(b) Shadow masked growth 1: Vapor-phase epitaxy in which the velocity of growth in a part under an overhang of a second semiconductor thin film deposited over a substrate via the first semiconductor thin film is decreased. This growth is disclosed, for example, on pp. 225 to 232 in Vol. 23. NO. 2 of Journal of Electronic Materials published in 1994.

(c) Shadow masked growth 2: vapor-phase epitaxy in which the velocity of growth in a part under a mask is decreased by moving and growing a GaAs substrate based upon a fixed Si or GaAs mask generally in the shape of a sheet using a specially designed reaction chamber and a wafer holder with two-stage constitution. This growth is disclosed, for example, on pp. 30 to 32 in Vol. 48 (1) of Appl. Phys. Lett. published in 1986.

However, the respective vapor-phase epitaxy methods shown in the above-described conventional film thickness modulation techniques (a) to (c) have the following defects:

(a) Selective area growth: (i) In a mixed crystal semiconductor including In and Ga or Al, the ratio of In to Ga (or In to Al) is remarkably increased as a rate of changing the thickness of a film on the same surface is increased. As a grown film must be thinner than a critical film in the overall area of a device, the freedom of designing the structure of the device is reduced. (ii) The thickness of a composition transition layer in a hetero-junction is increased, compared with that in a normal growth using a flat substrate. This is particularly disadvantageous to growth of a multiple quantum well.

(b) Shadow masked growth 1: (i) The manufacturing process of a device is complicated and the manufacturing unit price is increased. (ii) The flatness of the thickness of a film in the direction perpendicular to the direction in which the thickness of the film is modulated is poor. (iii) To obtain a large rate of change in the thickness of a film on the same surface, pressure for growth approximately equivalent to atmospheric pressure is required. Therefore, this shadow masked growth is not suitable for obtaining a steep heterojunction, and safety when the device is operated is reduced.

(c) Shadow masked growth 2: (i) The conventional system for vapor-phase epitaxy cannot be used. (ii) As a mask is generally in the shape of a sheet, the productive efficiency of this growth is basically low. (iii) There has been no report on a tapered-waveguide-integrated semiconductor guided-wave optical device fabricated using this growth. Therefore, it is presumed that this growth is not practical.

2. The conventional semiconductor guided-wave optical device

A laser diode for optical fiber communication will be given as an example below.

Generally, the diameter of an incident/outgoing beam to/from a semiconductor optical device such as a laser diode, an optical amplifier and an optical modulator is approximately one third to one fifth of that through an optical fiber and very small. Therefore, if a laser beam is passed through an optical fiber, a high-priced optical lens is used to prevent optical coupling efficiency from being reduced due to a mismatch in the diameter of a beam. However, to reduce the cost of a module for optical fiber communication hereafter, simple optical coupling between a laser diode and an optical fiber is indispensable. Therefore, a semiconductor laser at the outgoing end of which the diameter of a beam can be expanded is researched. To expand the diameter of a beam at the outgoing end, it is essential to modulate the thickness of a core layer and the width of a wave guide in the direction of the optical axis. referring to the former modulating the thickness of a core layer, application of the above-described fabricating methods (a) and (b) is tried.

For example, a laser diode wherein the diameter of an outgoing beam can be expanded by using selective area growth as a grown layer thickness modulation technique is described in Technical Digest 14th of IEEE International Semiconductor Laser Conference W2.4 published in September of 1994. A laser diode wherein the diameter of an outgoing beam can be expanded, by forming a film by growing a crystal using shadow masked growth as a grown layer thickness modulation technique, is described on pages 875 to 880 in Journal of Crystal Growth 145 published in 1994.

However, the performance of a tapered-waveguide-integrated laser diode (a beam expander-integrated laser diode) fabricated by these fabricating methods does not reach a practical level. One of these reasons is that a high quality semiconductor thin film crystal cannot be obtained. For example, in selective area growth (a) in which a dielectric thin film mask is provided next to an active layer formation scheduled area, an atom (material for growing a film) is supplied from a dielectric thin film mask when an active layer and a wave guide (layer) are grown in a vapor phase. At this time, controlling the ratio of supplied atoms for every element is difficult and a film with a desired composition cannot be precisely formed.

If the thickness of a layer is increased in a portion in which the composition of a film constituting the same layer is locally different (that is, a portion with unevenness of composition), a crystal defect in the film is caused. According to the fabricating method described in (a) by which a portion in which a thick film is grown under a disadvantageous condition that the ratio of supplied atoms for every element is indefinite, a crystal defect which cannot be allowed for laser radiation occurs. This fabricating method (a) is a well-known film forming method at present. However, the ratio of the thickness between core films (that is, the maximum value of the thickness of an active layer in a device/the value of the diameter of the end from which a beam is outgoing) cannot be enhanced up to 3, 4 or more without deteriorating crystallinity (that is, controlling a crystal defect at the same level as in normal vapor-phase epitaxy).

SUMMARY OF THE INVENTION

Therefore, an object of the present invention is to provide a fabricating method for fabricating a semiconductor guided-wave optical device provided with an in-plane tapered film thickness distribution obtained by changing the thickness of a compound semiconductor thin film crystal on the same surface of a substrate without deteriorating its crystallinity in a simple process.

Another object of the present invention is to provide a low-priced semiconductor guided-wave optical device with high reliability and provided with high functions using this fabricating method, and the fabricating method itself. Particularly, one of the objects is to provide the structure of a high output laser provided with satisfactory temperature characteristics with a low threshold which can expand an outgoing beam, and the fabricating method therefor.

Further, the other object of the present invention is to provide a semiconductor optical integrated device on the same substrate of which a plurality of semiconductor guided-wave optical devices are formed, and the fabricating method therefor.

Furthermore, another object is to provide a suitable structure of a semiconductor guided-wave optical device in case the device is applied to a waveguide-integrated semiconductor guided-wave optical device into which a laser, an optical amplifier, an optical modulator, an optical switch or an optical detector, or at least two of these are integrated, and the fabricating method therefor.

The other object of the present invention is to provide a new shadow mask used in vapor-phase epitaxy in which not only the thickness of a compound semiconductor thin film crystal can be modulated on the same surface of a substrate, but the optical crystal can be grown so that it is provided with high quality.

To achieve the above-described objects, a method of fabricating a semiconductor guided-wave optical device according to the present invention is characterized in that a semiconductor thin film is grown by loading a shadow mask that is separate from the above-described semiconductor substrate and that is provided with a masking part, an exposed area and a frame supporting the masking part over the semiconductor substrate via a wafer holder so that the masking part and the semiconductor substrate are separated by a predetermined space. Then, the thickness of a semiconductor thin film, which is the above-described core layer opposite to the masking part of the shadow mask that is at least in the center of the surface area of the semiconductor substrate, is thinner than that of a semiconductor thin film that is at least in the center of the surface area of the semiconductor substrate based upon a method of fabricating a guided-wave optical device provided with a core layer made of material with a higher refractive index than at least that of a semiconductor substrate on the substrate, and a cladding layer made of material with a lower refractive index than that of the core layer, and which is formed on and under the core layer, whereby the thickness of the core layer can be continuously and smoothly changed in the device.

In this case, it is suitable if a shadow mask is used in which the face (particularly, the masking part) reverse to the side opposite to at least the surface of the semiconductor substrate is covered with a dielectric thin film cap layer mainly made of material with a melting point higher than growth temperature.

If the masking part of the above-described shadow mask is thinner by a predetermined thickness than the frame for supporting the masking part, the shadow mask has only to be loaded over the semiconductor substrate to grow a semiconductor thin film crystal in a reaction chamber of a vapor-phase epitaxial system.

As a semiconductor guided-wave optical device fabricated as described above is provided with the structure in which the thickness of a core layer is readily thinned gradually, that is, the structure provided with tapered in-plane film thickness distribution provided with a high quality optical crystal, a beam spot can be readily expanded owing to this tapered core layer without deteriorating the characteristics of a laser. Therefore, an outgoing beam expanded laser can be realized, and this laser and a fiber can be readily coupled, controlling so that the coupling loss is small.

A shadow mask according to he present invention is characterized in that it is used in contact with or close to a substrate installed on a wafer holder in a reaction chamber of a vapor-phase epitaxial system. It is provided with at least an exposed area and a masking part so that a crystal of a semiconductor thin film can be grown at least in a predetermined area on the substrate, and so that at least one of the front and rear faces of the masking part is covered with a dielectric cap layer. The overall surface of the masking part may be covered with a dielectric cap layer. However, if the shadow mask is mainly formed by an InP or GaAs compound semiconductor, the surface of the masking part does not need to be covered with a dielectric cap layer.

In this case, it is suitable if the above-described dielectric cap layer is a silicon thermal oxide film and at least the surface layer of the dielectric cap layer may be made of any one of $SiN_x$, $SiO_xN_y$, $Al_2O_3$ and a-Si.

At least one of the front and rear faces of the masking part may be covered with a thin film cap layer on which an amorphous semiconductor is not deposited under a condition of growth using organometallic vapor-phase epitaxy.

At least the surface layer of the above-described thin film cap layer may be metallic, and in that case, it is suitable if at least the surface layer of the thin film cap layer is made of either tungsten or tungsten silicide.

The masking part of the above-described shadow mask may be mainly made of a semiconductor, ceramics, an alloy, or a metal with a high melting point. The above-described semiconductor may be any one of Si, InP and GaAs. The above-described alloy may be tungsten silicide and the above-described metal with a high melting point may be any one of tungsten, molybdenum, tantalum and niobium.

Further, the masking part mainly made of Si of the above-described shadow mask has a feature that the masking part is formed in the direction perpendicular to the main plane of the shadow mask, the section at least in one direction of the masking part is in the shape of a trapezoid, and the masking part is constituted by a face {100} and faces {111} constituting a trapezoid. In this case, a shadow mask may be fabricated by forming through holes on a Si substrate by anisotropic etching with KOH aqueous solution selectively.

If the above-described shadow mask includes a frame for supporting the masking part, a difference in level exists between the masking part and the frame on at least either the front or rear faces of the masking part. The frame may be thicker than the masking part, or the thickness of the frame may be equal to that of the masking part.

Further, it is suitable if the masking part of the above-described shadow mask is striped.

These objects and other objects and features of the present invention will be better understood by reference to the following description, taken in connection with the accompanying drawings.

BRIEF DESCRIPTION OF THE DRAWINGS

In the drawings, forming a part hereof, in which like reference characters denote like parts in the various views.

FIGS. 14A to 14E are sectional views showing another embodiment of a method of fabricating a shadow mask in the order of the main process;

DETAILED DESCRIPTION OF THE PREFERRED EMBODIMENTS

Embodiments according to the present invention will be described in detail below, referring to the attached drawings.
<First Embodiment>

First, a new shadow mask used for a method of fabricating a semiconductor guided-wave optical device according to the present invention and for controlling the thickness of a film formed on the same surface when a crystal is grown with InP family III–V compound semiconductor by this shadow mask will be described.

Figure 1A:
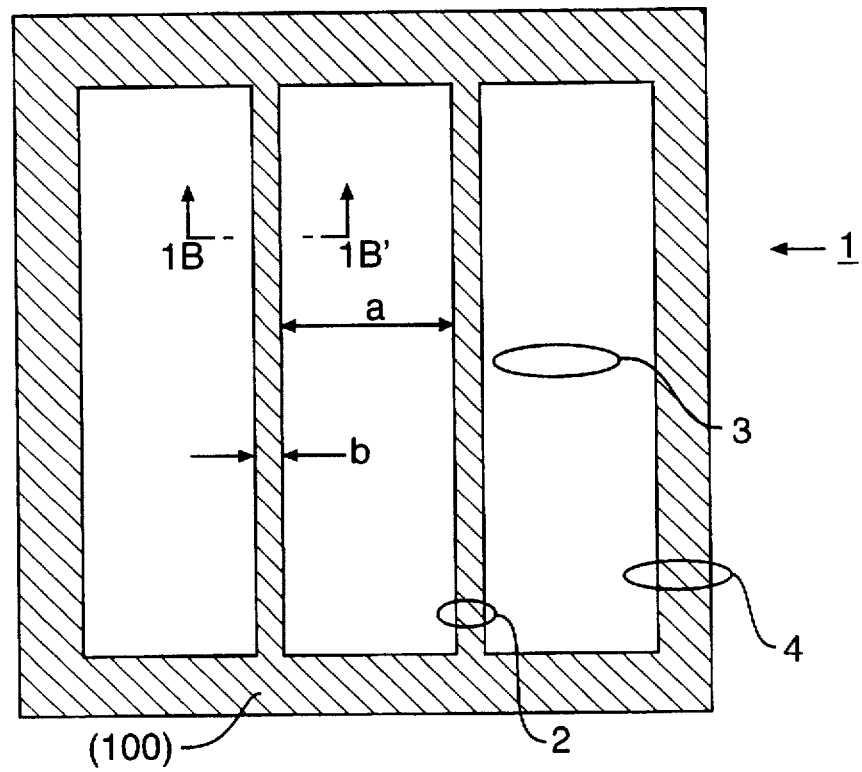
FIGS. 1A and 1B are a plan and a sectional view, respectively, schematically showing an embodiment of a shadow mask according to the present invention.
Figure 1B:
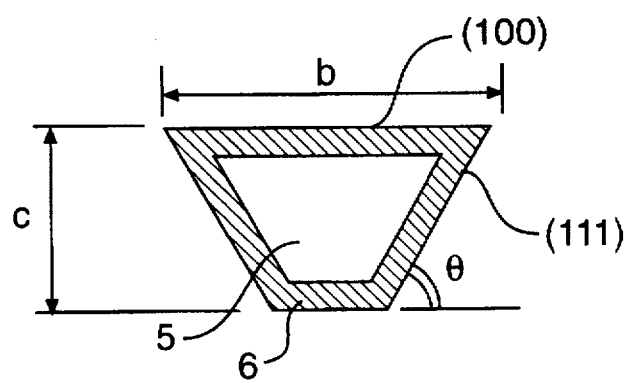

A shadow mask 1 shown in FIG. 1A is fabricated by anisotropic wet etching using photolithographic techniques and KOH aqueous solution based upon the face (100) of a Si substrate covered with a thermal oxide film. FIG. 1B is a sectional view showing a part viewed along a line A–A' in FIG. 1A. The shadow mask 1 is constituted by a masking part 2, an exposed area 3 and a frame 4. The shadow mask 1 is mainly made of Si 5 and the overall surface is covered with a Si thermal oxide film 6. In this case, as shown in FIG. 1B, the side walls of the striped masking part 2 are the faces {111} and the angle θ is approximately 54 degrees. In FIGS. 1A and 1B, reference character "a" denotes the width of the exposed area 3, "b" denotes the width of the upper surface of the masking part 2, and "c" denotes the thickness of the masking part 2.

Next, referring to FIGS. 13A to 13E, a method of fabricating the above-described shadow mask 1 will be briefly described.

Figure 13A:
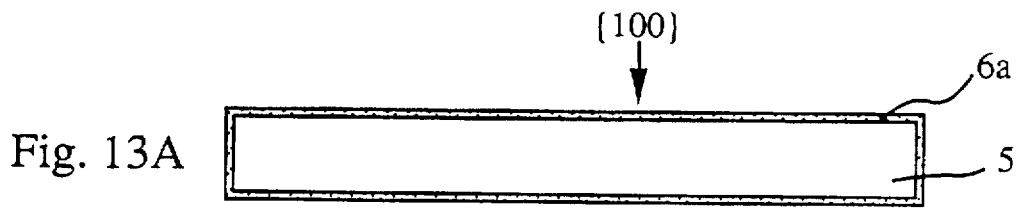
FIGS. 13A to 13E are sectional views showing an embodiment of a method of fabricating a shadow mask in the order of the main process.
Figure 13B:
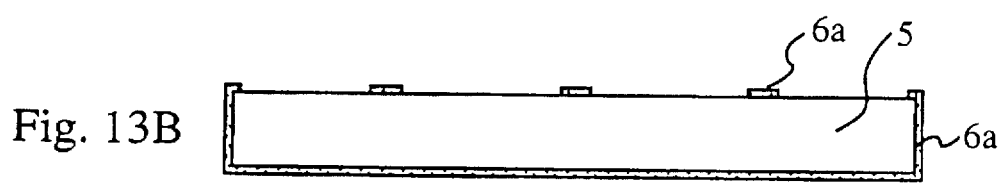

First, the overall surface (100) of a Si substrate 5 is covered with a thermal oxide film 6a as shown in FIG. 13A when the surface is oxidized. The thermal oxide film 6a forming the upper surface of this Si substrate is patterned as shown in FIG. 1A using photolithographic techniques. That is, the thermal oxide film 6a is removed selectively as shown in FIG. 13B.

Figure 13C:
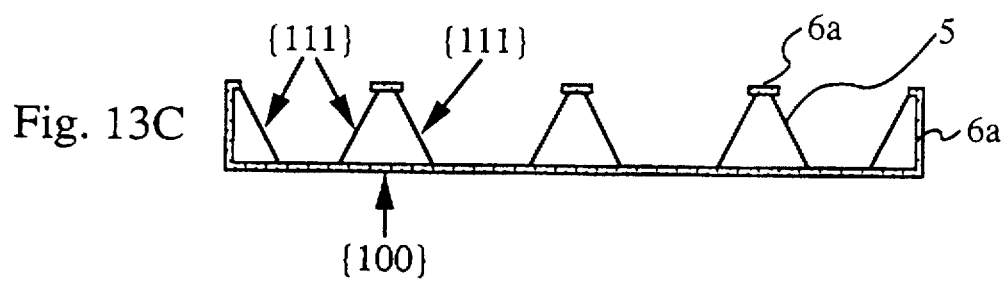

Next, anisotropic etching using a KOH aqueous solution is performed with the patterned thermal oxide film 6a as a mask to etch the Si substrate 5. At this time, as the thickness of the Si substrate 5 is approximately 150 to 300 Wm, the faces {111} are also a little etched as shown in FIG. 13C.

Figure 13D:
Figure 13E:
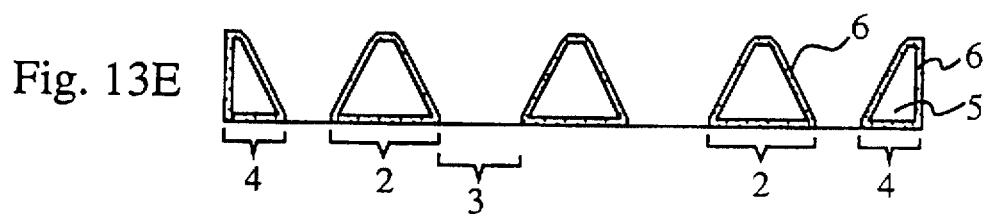

Thereafter, the overall thermal oxide film 6a is removed as shown in FIG. 13D and a thermal oxide film 6 is formed on the overall surface by oxidizing the surface as shown in FIG. 13E. when the Si substrate is reversed, a shadow mask 1 in which the thickness of the frame 4 and the masking part 2 is equal shown in FIGS. 1A and 1B can be obtained.

Figures 2A, 2B:
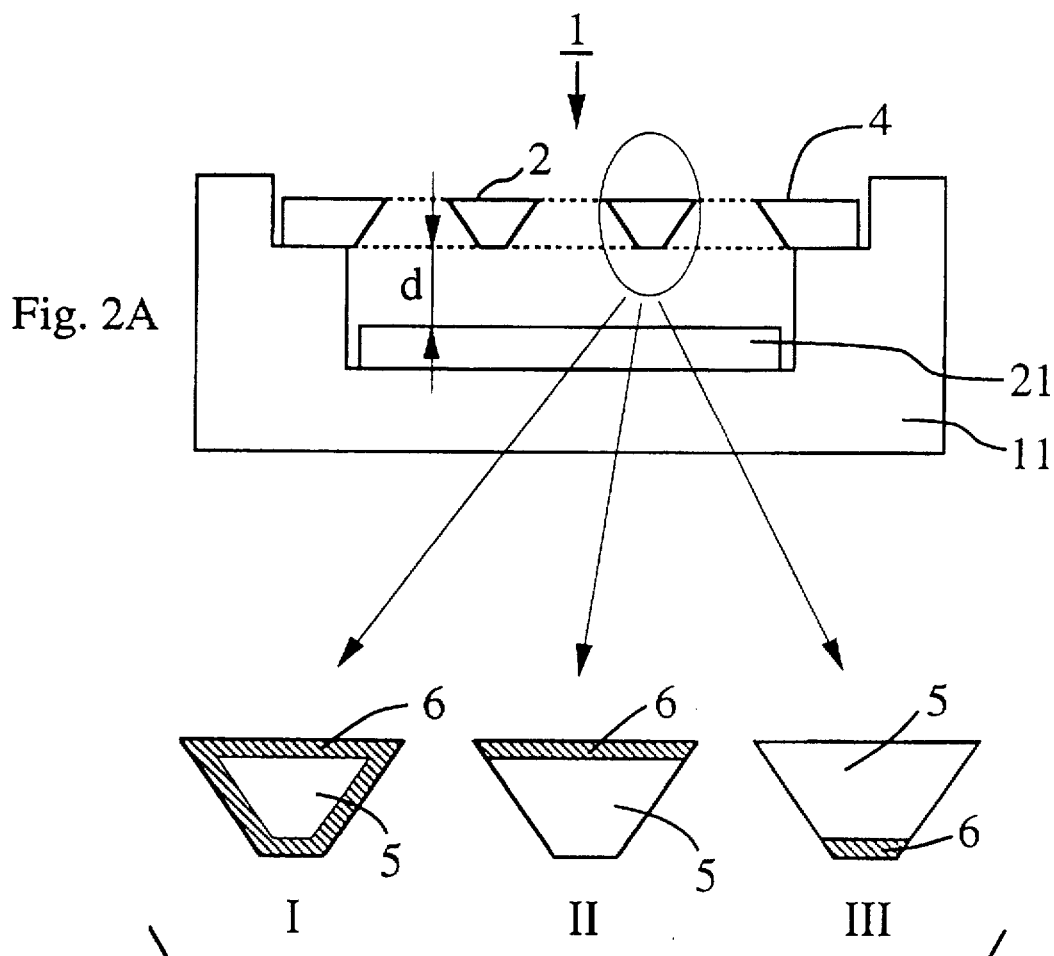
FIG. 2A is a sectional view showing a state in which a shadow mask is loaded onto a wafer holder over a semiconductor substrate and FIG. 2B is an enlarged sectional view showing three types of structures of a masking part of a shadow mask.
Figure 3:
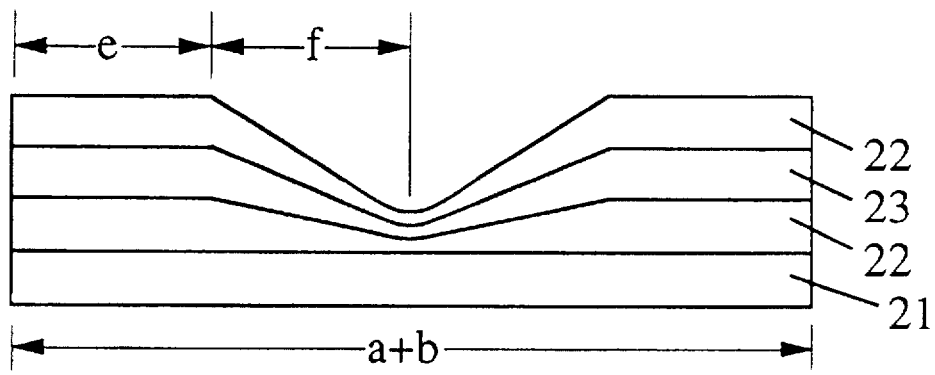
FIG. 3 is a schematic drawing showing the section of a multilayer film formed using a shadow mask.

Next, as shown in FIG. 2A, an n-type (100) InP substrate 21 and a shadow mask 1 are installed on a wafer holder 11. The distance d between the shadow mask 1 and the InP substrate 21 is approximately a few tens μm. However, the distance is not limited to this value and the distance can be set to an appropriate value if necessary. This wafer holder 11 is installed in a reaction chamber provided in a MOVPE system as in the case of normal growth. A double hetero structure with the thickness of a film in the case of normal reduced-pressure growth for which a shadow mask 1 is not used (that is, with the thickness of an undoped $In_xGa_{(1-x)}As$ (x=0.53, compound wavelength: 1.67 μm) film 23, the lattice of which is matched with that of an undoped InP film 22, and the InP film 22 which are each 500 nm) is grown using a shadow mask 1. As a result, a multilayer film in the shape of the section shown in FIG. 3 is automatically formed. However, in FIG. 3, a multilayer film for the length to which the width a of an exposed area 3 of a shadow mask 1 and the width b of a masking part are added is shown with a part immediately under the masking part 2 in the center.

In an area on the surface of an InP substrate 21 on which the exposed area 3 is vertically projected, that is, in an area of the InP substrate 21 opposite to the exposed area 3, a flat grown layer as shown at e in FIG. 3 can be obtained. In this area e, the thickness of the InP film 22 and the $In_xGa_{(1-x)}As$ film 23 and the composition of $In_x$ of the film 23 are approximately equal to those when they are normally grown without using a shadow mask 1. In the meantime, in an area on the surface of the InP substrate 21 on which the masking part 2, the thickness of both the InP grown film 22 and the $In_xGa_{(1-x)}As$ grown film 23 is reduced as shown in an area f in FIG. 3, and a grown layer the thickness of which is tapered can be obtained. this is because the material for growth vertically diffused toward the InP substrate 21 from the boundary layer in a vapor phase is interrupted by the masking part 2 and only the material for growth diffused in parallel with the substrate 21 is supplied. The tapered angle of the grown layers 22 and 23 based upon the substrate can be controlled y changing the size and structure of the masking part 2 or the distance d between the shadow mask 1 and the InP substrate 21. In an area in which the InP substrate 21 is thinnest, the thickness of the InP layer 22 and the $In_xGa_{(1-x)}As$ layer 23 is respectively approximately one-fifth that in the area e. As the thickness of a layer in the tapered area f is thinner, the composition of $In_x$ in the $In_xGa_{(1-x)}As$ layer 23 is reduced. Misfitted dislocation hardly occurs in the tapered area f because of the relationship between the thickness of a critical film and the change of composition (a distortion factor). The reduction of the composition of $In_x$ in the tapered area f is caused by the difference in a diffusion coefficient between In and Ga in a vapor phase.

Next, dependence of optical crystallinity of a compound semiconductor thin film upon the material of the surface of a shadow mask will be described. A shadow mask 1 provided with the masking part 2 with the structure of the section shown as II and III in FIG. 2B is also fabricated in addition to that with the structure of the section shown as I in FIG. 2B. The surface reverse to the face opposite to the InP substrate 21 of the masking part with the structure shown as II is covered with a Si thermal oxide film 6. The surface opposite to the InP substrate 21 of the masking part with the structure shown as III is covered with a Si thermal oxide film 6. The surface of the frame 4 is also made of the same material as that of the shadow mask 1 provided with the masking part 2 with the structure shown as I to III.

A double hetero structure consisting of an InP film 22 and an $In_xGa_{(1-x)}As$ film 23 respectively with the same structure is grown using any of these shadow masks 1 under the same condition as in the crystal growth described first, that is, under such a condition that the thickness of each film is 500 nm in normal growth without using a shadow mask. As a result, the structure shown in FIG. 3 can be obtained as in the case where a shadow mask 1 provided with the masking part with the structure shown as I in FIG. 2B is used. The photoluminescence (PL) of only the area e formed with any structure shown as I to III in FIG. 2B is measured in the air with room temperature.

Figure 4:
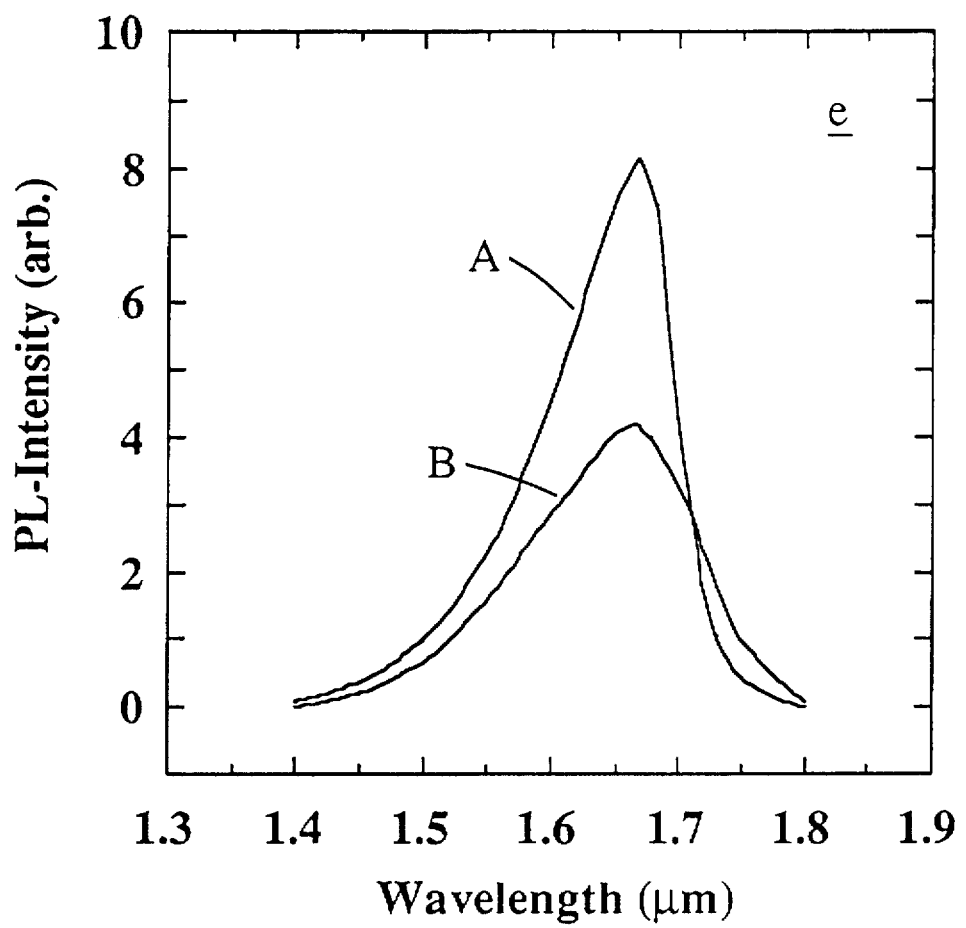
FIG. 4 is a chart showing the characteristics of a grown film in the intensity of photoluminescence (PL) depending upon the difference among the structures of a masking part shown in FIG. 2B.

If a shadow mask 1 provided with the masking part with either structure shown as I and II is used, a spectrum A that has a higher intensity of PL, as shown in FIG. 4, is obtained. The intensity of photoluminescence (PL) and the full width at half maximum of this spectrum A are equal to those in normal reduced-pressure growth without using a shadow mask 1.

If a shadow mask provided with the masking part with the structure shown as III is used, a spectrum B that has relatively approximately half the intensity of PL is obtained and the full width at half maximum is also a little increased. However, it is in the range in which it is allowed practically.

The main cause of reduction of optical crystallinity in the case of the shadow mask 1 provided with the masking part with the structure shown as III in FIG. 2B can be explained as follows: Amorphous InP 22 and InGaAs 23 are deposited on the shadow mask 1, the surface of which is made of Si 5 when the crystal is grown. P and As molecules with high vapor pressure are readily reevaporated from these amorphous semiconductors. These molecules generate a nuclear product in a vapor phase in reaction on the material for growth and this nucleus is taken in a grown layer, alternatively, reevaporated As and P molecules may be taken in a grown layer together with an adduct such as a contamination. As a result, a crystal defect and the non-emission recombined center occur.

On the contrary, if the shadow mask 1 has the masking part with either structure shown as I and II in FIG. 2B, polycrystalline InP 22 and InGaAs 23 can be deposited on the shadow mask 1 because a Si thermal oxide film 6 is formed on the surface of the shadow mask. An atom and a molecule constituting the material for growth are not readily reevaporated from these polycrystalline semiconductors. Therefore, a process of growth occurring on the surface of the area e shown in FIG. 3 is equal to a normal process of growth without using a shadow mask 1, and the optical crystallinity of an obtained semiconductor thin film is not deteriorated. However, it is possible that no deposit is generated on the shadow mask 1 depending upon the condition of growth or the state of the surface of the thermal oxide film 6. In this case, a phenomenon in which the velocity of growth is increased readily occurs in a portion in the vicinity of the tapered area f in the area e shown in FIG. 3. This is the same principle as in a well-known selective area growth using a dielectric thin film mask. This phenomenon may be inappropriate to the specific structure of a semiconductor optical device. However, a flat grown layer can be formed by optimizing a variety of conditions.

The advantages of an in-plane grown film thickness control method using a shadow mask according to the present invention will be as follows, compared with the conventional in-plane grown film thickness control methods (a) to (c) described above:

(a) If the above-described control method using a shadow mask according to the present invention is compared with selective area growth: 1. A grown layer can be readily thinner than the critical film over the overall area of a device. Therefore, optical crystallinity is hardly deteriorated. 2. The thickness of a composition transition layer in a hetero-junction is not increased. Therefore, the above-described control method using a shadow mask according to the present invention is advantageous to a strained-multiple quantum well essential for a high performance semiconductor guided-wave optical device and provided with high quality. Particularly, for the former, the control method is advantageous because a thick layer in which a crystal defect readily occurs can be grown under the same condition as in normal vapor-phase epitaxy. Thereby, a laser device which is not only at a practical level but is free from a crystal defect in a portion in which a film with a ratio of thickness between core films being 3 to 4 or more is thick can be fabricated.

(b) If the above-described control method using the shadow mask according to the present invention is compared with shadow masked growth 1: 1. The manufacturing process of a semiconductor guided-wave optical device can be reduced. As a result, it can be expected that the manufacturing unit price will be reduced. 2. The manufacturing yield can be enhanced because the flatness of a film in the direction perpendicular to the direction in which the thickness of the film is modulated is satisfactory. 3. Normal growth pressure (reduced pressure) can be utilized, therefore, a steep hetero-junction can be readily obtained and the probability that carrier gas and material gas are leaked when a device is operated is relatively low.

(c) If the above-described control method using a shadow mask according to the present invention is compared with shadow masked growth 2: 1. As the conventional vapor-phase epitaxial system can be used, this control method is advantageous with regard to the cost. 2. relatively high productive efficiency can be obtained because a masking part is striped. 3. This control method is a practical growth by which a tapered-waveguide-integrated semiconductor guided-wave optical device can be fabricated.

The case that InGaAsp material is used is described above: however, it need scarcely be said that InGaAlAs material or other semiconductor material can be also applied. It also need scarcely be said that even if the growth pressure is set to approximately the atmospheric pressure of 760 Torr, the effect of controlling the thickness of an in-plane grown film using a shadow mask according to the present invention can be utilized.

In this embodiment, a shadow mask 1 is maintained apart by a predetermined distance d from InP semiconductor substrate 21 via a wafer holder 11 as shown in FIG. 2A. An oxide film 6 may be left on the face of the frame 4 of the shadow mask opposite to the semiconductor substrate 21, and an oxide film 6 selectively removed from the face of the masking part 2 opposite to the semiconductor substrate 21 creating a difference in level thickness. The shadow mask 1 may be loaded on the semiconductor substrate 21 in place of the wafer holder 11. The predetermined distance d between the semiconductor substrate 21 and the masking part 2 of the shadow mask 1 in this case is equal to the thickness of the oxide film.

<Second Embodiment>

Next, a method of fabricating a semiconductor guided-wave optical device using a shadow mask 1 described in the first embodiment, that is, a shadow mask the section of which is in the shape of a reverse trapezoid (thinned toward the side of a semiconductor substrate) wherein a dielectric thin film is formed at least on the side reverse to the face opposite to the semiconductor substrate, will be described below, referring to a beam expander-integrated laser diode for optical fiber communication which is operated in a band with a wavelength of 1.3 μm as an example.

First, a thermal oxide film of 1 μm thick is formed on one side (100) surface of a Si substrate of 300 μm thick. This Si substrate is selectively bored to fabricate a shadow mask 1 shown in FIG. 1A. A hole forming an exposed are 3 of the Si substrate, that is, a through hole can be readily formed by anisotropic wet etching using the conventional photolithography and KOH aqueous solution. Thereafter, the thermal oxide film is all removed. Next, when a new thermal oxide film 6 of 1 μm thick is formed on the overall surface of the shadow mask 1, the shadow mask 1 shown in FIGS. 1A and 1B is completed. The shadow mask is mainly made of Si 5 and the size is as follows: Width a of the exposed area 3: 772 μm Width b of a masking part 2: 228 μm thickness c of the masking part 2 and a frame 4: 150 μm θ: 54 degrees. The sides of the masking part 2 have the {111} faces. In this embodiment, as the shadow mask 1 is designed for a substrate 2 inches long, each side thereof is 50 mm long and the width of the ram 4 is 3 mm. That is, only two masking parts are shown in FIG. 1A; however, practically, 46 striped masking parts 2 are formed. This shadow mask 1 is provided with a mechanical strength which can bear using the next process.

Next, an n-type InP semiconductor substrate 21, both surfaces of which are (100), and the above-described shadow mask 1 are arranged on a wafer holder 11 for vapor-phase epitaxy as shown in FIG. 2A. Then, a crystal is grown by MOVPE. The substrate is heated up to 600° C. and the pressure of a reaction tube at the time is 75 Torr. In this case, a distance d between the lower surface of the shadow mask 1 and the upper surface of the InP substrate 21 is approximately 150 μm. The shadow mask 1 is installed on the wafer holder 11 so that the direction of the striped masking part 2 and the direction [01–1] of the InP substrate 21 parallel.

Figures 1, 5A:
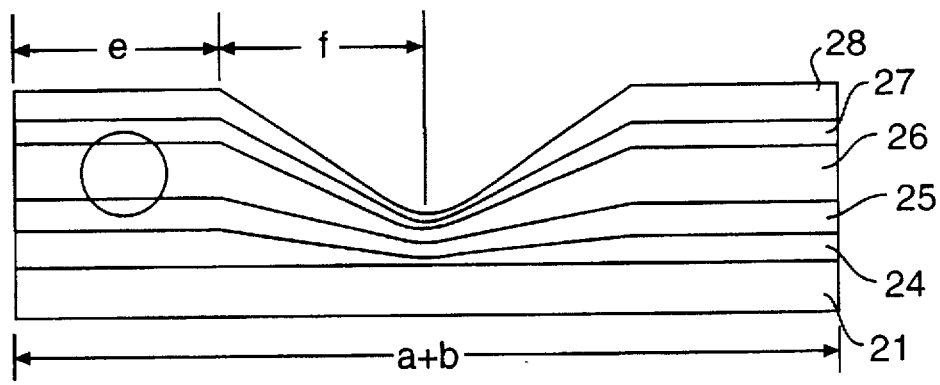
FIGS. 5A and 5B are respectively a schematic drawing of the section of the main part and a perspective drawing of the whole showing the rough constitution of a multilayer film formed by a fabricating method using a shadow mask according to the present invention.

The condition of growth is set so that growth in an area on which the vicinity of the center of the exposed area 3 is vertically projected, that is, the vicinity of the center of an area e shown in FIG. 5A, has the following values: An n-type InP layer 24 of 0.2 μm thick, an n-type InGaAsP (composite wavelength: 1.10 μm) layer 25 of 0.1 μm thick, a strained-multiple quantum well active layer 26 made of any of the elements which belong to the sixth period, a p-type InGaAsp (composite wavelength: 1.10 μm) layer 27 of 0.05 μm thick, and a p-type InP layer 28 of 0.1 μm thick are formed in the stated order. The strained-multiple quantum well active layer 26 is constituted by an InGaAsp (composite wavelength:

1.45 μm) well layer 41 of 6.0 nm thick with compressive strain of 1%, and an InGaAsp (composite wavelength: 1.10 μm) barrier layer 42 of 10 nm thick as shown in the enlarged view showing a part shown in FIG. 5A.

After growth, the InP substrate 21 on which the above-described compound semiconductors are deposited is cloven and the thickness of the films are measured with a scanning electron microscope. As a result, as shown in FIG. 5A, it is proven that the thickness of a grown film constituting a core layer immediately under the center of the masking part 2 is reduced up to approximately one-fifth of the thickness in an area on which the vicinity of the center of the exposed area 3 is vertically projected. However, in FIG. 5A, the section of the substrate is shown by the length to which the width a of the exposed area 3 of the shadow mask 1 and the width b of the masking part are added with an area immediately under the masking part 2 as the center.

Next, after supply of gas is suspended and the shadow mask 1 is removed, the p-type InGaAs layer 29 of 0.2 μm thick is formed.

Figures 2, 5A:
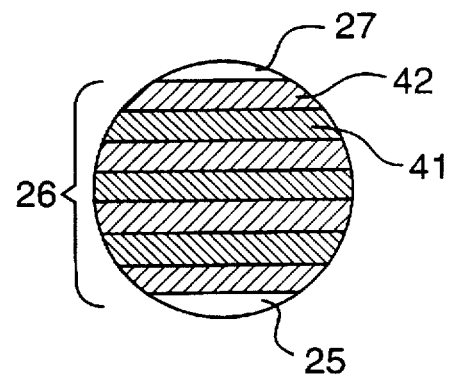
Figure 5B:
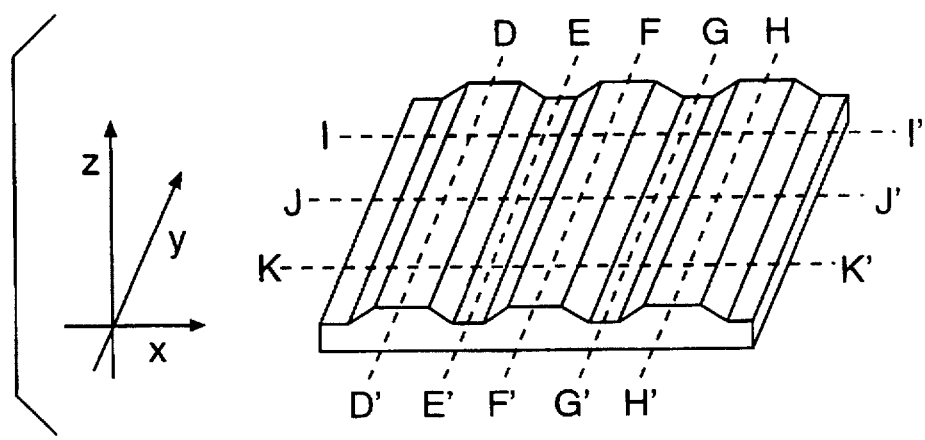

As shown by dashed lines in the perspective drawing in FIG. 5B, the substrate is processed by unit, each consisting of a semiconductor multilayer film enclosed by lines D–D', E–E ', F–F', G–G', H–H' and lines I–I', J–J', K–K' perpendicular to the above-described lines so that it is provided with a laser structure provided with a tapered ridge strip wave guide. First, only a part with a stripe pattern 55 of the highly doped p-type InGaAs layer 29 (which is to function as a cap layer) of 0.2 μm thick of a semiconductor multilayer film is removed. The stripe pattern 55 is formed along the x-axis in the section of a semiconductor multilayer film. (See FIG. 5B.) A striped area surrounded by these two stripe patterns 55 functions as a ridge stripe wave guide.

Next, the p-type InP layer 28 (which is to function as a cladding layer) is wet-etched with an aqueous solution in which hydrobromic acid and phosphoric acid are mixed to form a groove. Thereby, the p-type InP layer 28 surrounded by the stripe patterns 55 is formed into a reversed mesa (that is, the section is approximately in the shape of a reversed trapezoid) ridge as shown in partial enlarged views Al and A2 in FIG. 6.

Next, a silicon oxide film 52 is formed on the upper face of a semiconductor multilayer film and a polyimide resin 51 is spin-coated. After the polyimide resin other than in the groove is removed by etchback in which the overall surface is dry-etched, the silicon oxide film 52 formed on the upper face of the p-type InGaAs layer 29 on the reversed mesa p-type InP layer 28 is removed.

At last, the upper electrode (a p-type electrode) 54 consisting of, for example Ti/Pt/Au is formed so that it is in contact with the upper face of the p-type InP layer 28, and the lower electrode (an n-type electrode) 53 consisting of, for example AuGe/Ni/Pd/Au is formed. These electrodes are cut in parallel to the surface in the y- and z-axes along lines D–D', E–E', F–F', G–G' and H–H' and in the x- and z-axes along lines I–I', J–J' and K–K', and a semiconductor laser device can thus be obtained. In this case, a laser beam outgoing end is approximately parallel to the yz face shown in FIG. 5B. The width g of a ridge on the bottom shown in a partial enlarged view A2 in FIG. 6 is 2.5 μm. However, as shown in a partial enlarged view Al in FIG. 6, the width h of a ridge on the bottom is widened up to 8.0 μm in the shape of a taper at the laser beam outgoing end. The length of a tapered area in which the width of a ridge changes by degrees is 150 μm and the length of the over device is 500 μm. A high reflection film with reflectance of 70% is formed on the rear end face of the laser. As shown in a partial enlarged view B1 in FIG. 6, a core layer is tapered in the direction of the outgoing end face.

Figure 7:
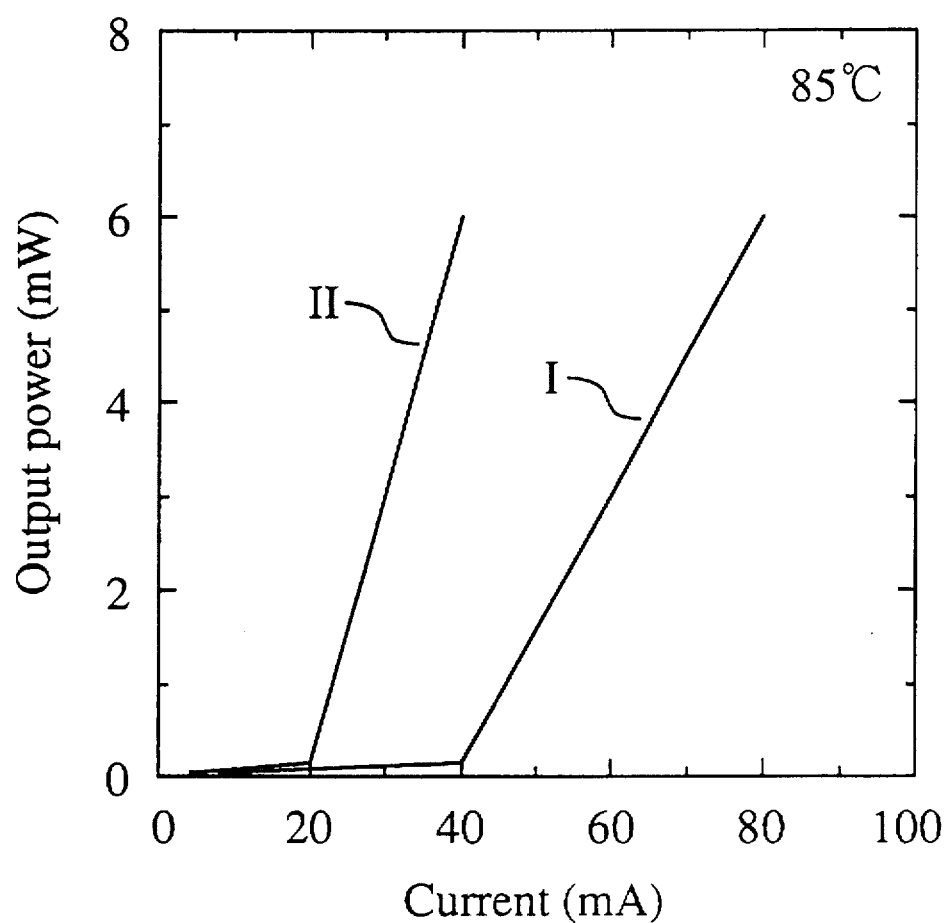
FIG. 7 is a chart showing the relationship between injected current and optical output device according to the present invention formed using a shadow mask, and a semiconductor guided-wave optical device formed by the conventional selective area growth.

The fabricated device shows satisfactory characteristics in that its threshold is 6 to 8 mA and its emission efficiency is 0.50 W/A when the device is continuously operated. The oscillation wave length at room temperature is 1.3 μm. As shown by a curve II showing the relationship between inrush current and optical output power in FIG. 7, it is possible to achieve a threshold of 18 to 22 mA and an emission efficiency is 0.33 W/A even if the device is operated at a room temperature of 85° C., which characteristics are equal to the characteristics of a device with the conventional structure without a beam expander, and which are shown by a curve I showing the relationship between inrush current and optical output power. The diameter of a beam spot on the rear end face on which the width g of a ridge is 2.5 μm is approximately 1.5 μm. The spot diameter of a laser beam emitted from the font end face on which the width h of a ridge is 8.0 μm is expanded five times up to 7.5 μm. When this laser is coupled to a single mode fiber with a core diameter of 10 μm a coupling loss of 2 dB or less can be realized with horizontal and vertical positioning precision of ±3 μm. When the long-term reliability of the device is evaluated at a high temperature of 85° C., an estimated life of 0.1 million hours or more is verified. The curve I shows the relationship between inrush current and optical output power of a beam expander-integrated laser diode fabricated by the conventional selective are growth using a dielectric thin film mask.

Figure 22:
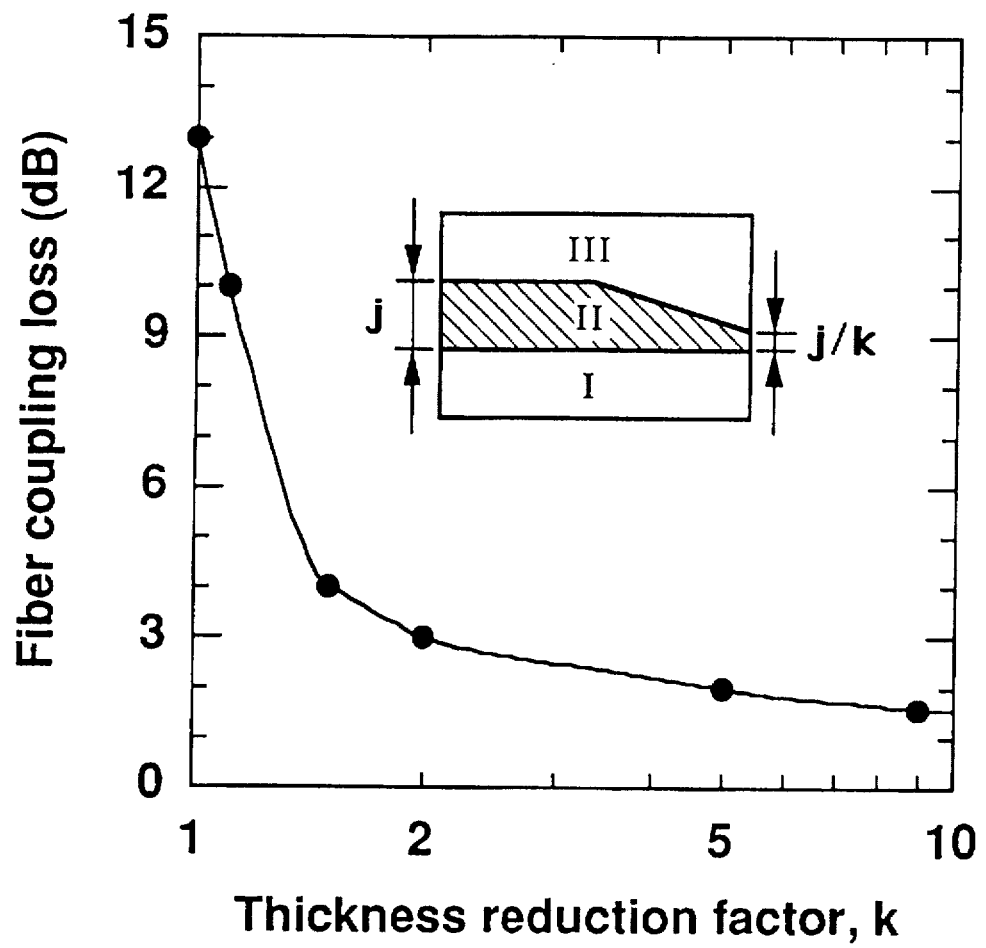
FIG. 22 is a chart showing the relationship between the thickness reduction factor of a tapered wave guide and fiber coupling loss.

FIG. 22 shows the relationship between fiber coupling loss and thickness reduction factor k. In a sectional view showing a semiconductor guided-wave optical device schematically shown in FIG. 22, a semiconductor layer I is substrate or a cladding layer made of InP or others, a semiconductor layer II is a core layer made of InGaAsp or others with a refractive index higher than that of the substrate or the cladding layer, a semiconductor layer III is a cladding layer, and a reference character $j$ denotes the thickness of the core layer on the rear end face of the device. The front end face of the device where the thickness of the semiconductor layer II is j/k is coupled to an optical fiber. Generally, fiber coupling loss is required to be reduced up to 3 dB or less to realize the specifications of a module for optical fiber communication and an optical communication system. Therefore, as shown in FIG. 22, the thickness reduction factor k is required to be 2 or more. If the thickness of the core layer at the outgoing end is $d_0(=j/k)$ and the maximum thickness of the core layer inside the optical device is $d_{max}(=j)$, the thickness reduction factor is required to be set in the range of $0<d_0/d_{max} \leq 0.5$. This relationship also holds true in each embodiment of a semiconductor guided-wave optical device described later.

One of the reasons why the characteristics of a beam expander-integrated laser diode fabricated by a fabricated method according to this embodiment are satisfactory is that the above-described laser diode is almost free from bad effects caused by provided a beam expanding function, because the basic structure of the laser and the fabricating process are approximately the same as a normal fabricating method without using a shadow mask 1. One of the reasons is that the optical crystallinity of a semiconductor thin film, particularly the strained-multiple quantum well layer 26 in a laser active area, is high enough.

As described above, the spot diameter of a beam outgoing from the front end face of the laser is expanded five times as wide as the diameter of a beam spot on the rear end face of 1.5 μm. This is because, as a ridge is widened in this structure and the thickness of an active layer is thinned, the effect by which light is confined in the active layer is gradually weakened and the distribution of the intensity of light is readily expanded to the periphery. In this case, scattering of light is controlled to be sufficiently low by setting the length of a tapered area to 150 μm. Therefore, even if the laser and a single mode fiber with a core diameter of 10 μm are coupled, a coupling loss 2 dB or less can be realized with horizontal and vertical positioning precision of ±3 μm.

As described above, a beam expander-integrated laser diode can be fabricated without deteriorating the characteristics of a laser beam by combining structure in which the thickness of an in-plane core layer is modulate when grown using a shadow mask, with structure in which the width of a wave guide is modulated by processing.

It is assumed that the deterioration, which occurs when a laser diode with a short wavelength band of approximately 1 μm or shorter is operated at high output, is caused by deterioration of a crystal on the end face with high optical density. In the meantime, according to a fabricating method according to the present invention, the diameter of a beam spot can be expanded without deteriorating the quality of a semiconductor crystal. Therefore, the deterioration of a crystal on the end face when a laser is operated at high output due to reduction of optical density on an outgoing end face can be reduced. According to a fabricating method of the present invention, the life of a laser device with a short wavelength band of approximately 1 μm or shorter can thus also be improved.

The above-described method of fabricating a semiconductor guided-wave optical device according to the present invention can be widely applied to a semiconductor guided-wave device in the range of a wavelength of 0.3 to 1.7 μm. For example, the range of a wavelength of 0.3 to 1.7 μm which is equivalent to the range of whitish purple, red and a near infrared color, can be constituted by a compound semiconductor which belongs to families III –V, and a laser diode from which a laser beam in a band of a short wavelength of 0.3 μm is emitted can be applied to a light source for writing onto a digital vido disc. The basic structure of a laser diode with a band of a wavelength of 0.3 μm is approximately equal to that of a laser diode with a band of a wavelength, of 0.98 μm described in a fifteenth embodiment below. For an example of a material constituting a laser diode from which a laser beam in a band of wavelength of 0.3 μm is emitted, an active layer is constituted by a strained-quantum well layer consisting of a GaN well layer and an AlN barrier layer, a cladding layer which is formed on and under the active layer is formed by AlN, and a substrate is formed SiC. A semiconductor guided-wave optical device with a band of a wavelength of 1.7 μm is applied to an optical detector and the basic structure of the device is equal that of a laser diode with a band of a wavelength of 1.3 to 1.55 μm. For an example of a material constituting a semiconductor guided-wave optical device from which a laser beam in a band of a wavelength of 1.7 μm is emitted, an active layer is constituted by a strained-quantum well layer consisting of an InGaAsSb well layer and a GaSb, a cladding layer which is formed on and under the active layer is formed by GaSb, and a substrate is formed by GaSb.

<Third Embodiment>

Referring to FIGS. 15A and 15B and FIGS. 16A to 16C, a method of fabricating a semiconductor guided-wave optical device with a shadow mask directly loaded onto a semiconductor substrate without using a wafer holder 11, to form a beam expander-integrated laser diode as in the second embodiment, will be described below.

Figure 16A:
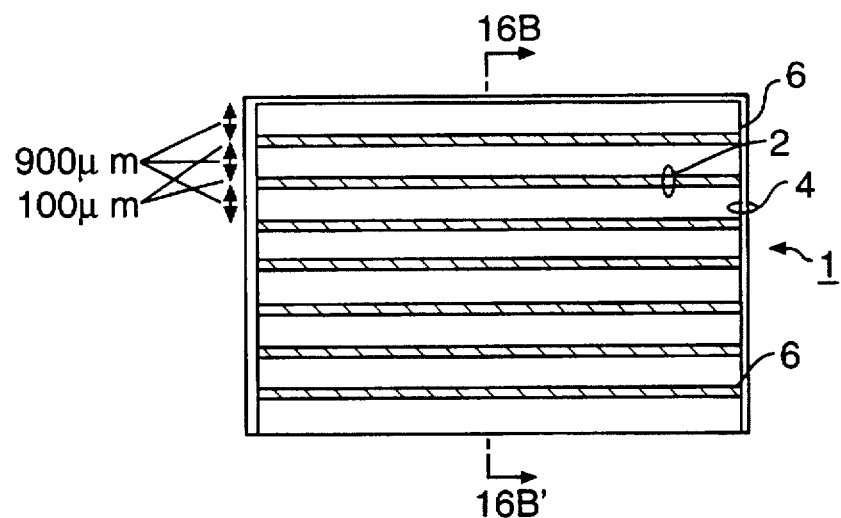
FIG. 16A is a plan view showing another example of a shadow mask.
Figure 16B:
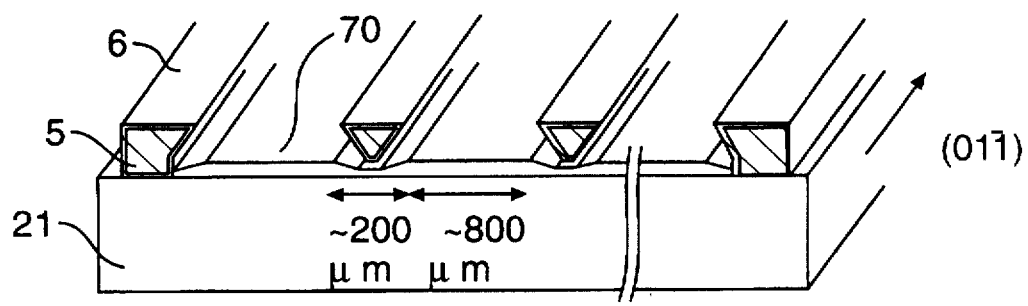
FIG. 16B is a perspective drawing of a section of the main part when a semiconductor thin film is grown using this shadow mask.

FIG. 16A is a plan view showing a shadow mask 1. In this embodiment, the width of a striped masking part 2 is set to 100 μm and the width of an exposed area 3 is set to 900 μm. FIG. 16B is a perspective drawing showing the section of the shadow mask viewed along a line A–A' in FIG. 16A after the shadow mask 1 is loaded onto a semiconductor substrate, and a multilayer film 70 grown by MOVPE. Only two masking parts are shown in FIG. 16B; however, practically, multiple striped masking parts 2 are formed.

A thermal oxide film 6 of 1 μm thick is formed on the surface (100) of a Si substrate, and the shadow mask 1 shown in FIG. 16A is fabricated based upon this Si substrate. This shadow mask 1 can be readily fabricated by anisotropic wet etching using the conventional photolithography and a KOH aqueous solution. The striped side walls of the masking part have the {111} faces. In detail, the shadow mask may be fabricated by a fabricating method shown in FIGS. 14A to 14E, described later in the seventh embodiment. However, the shadow mask is etched so that a difference in level between a frame 4 and the masking part 2 is 1 μm in this embodiment.

Figure 15A:
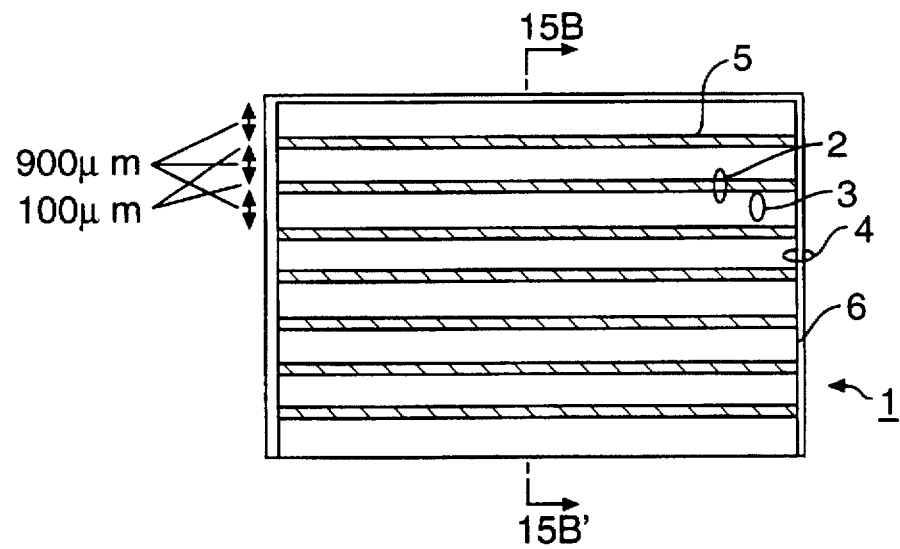
FIGS. 15A and 15B are a bottom view and a perspective drawing of a section of the main part, respectively, showing another embodiment of a shadow mask.
Figure 15B:
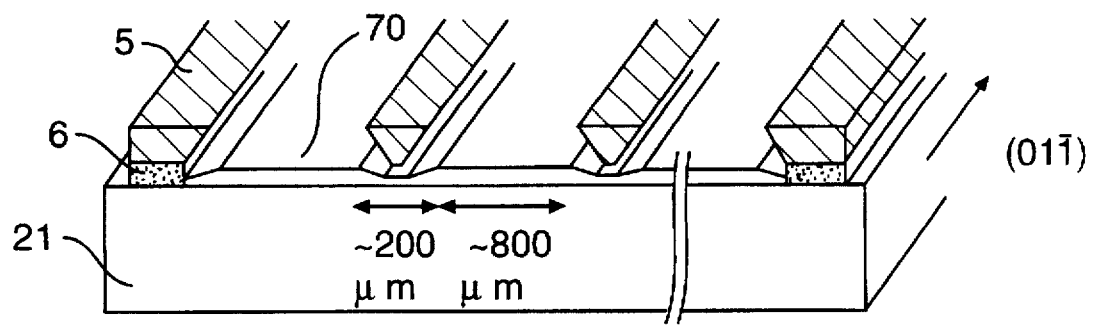

Next, this shadow mask 1 is loaded onto an n-type InP semiconductor substrate 21. In this case, the lower surface of the masking part 2 of the shadow mask 1 is lifted by 1 μm from the upper surface of the InP substrate 21 as shown in FIG. 16B. A shadow mask 1 wherein a thermal oxide film 6, other than that on the frame 4 is removed as shown in FIG. 15A and in the perspective drawing of the section in FIG. 15B, may be used. However, the shadow mask 1, if the oxide film 6 is left at least on the face opposite to the substrate 21 and on the reverse side face with respect to the above-described face, the crystallinity of a grown film is preferable. The shadow mask 1 is loaded so that the direction of the stripe of the masking part 2 is parallel to the direction of [01~1] of the InP substrate.

Next, for a multilayer film 70, an n-type InP buffer layer 24 of 0.2 μm thick, a lower n-type InGaAsp optical guide layer (composite wavelength: 1.10 μm) 25 of 0.1 μm thick, a strained-multiple quantum well active layer 26 formed by any element which belongs to the sixth period and consisting of an InGaAsp (composite wavelength: 1.45 μm) well layer of 6.0 nm of thick with compressive strain of 1% and an InGaAsp (composite wavelength: 1.10 μm) barrier layer of 10 nm thick, an upper InGaAsp (composite wavelength: 1.10 μm) optical guide layer 27 of 0.05 μm thick, and a p-type InP cladding layer 28 of 0.1 μm thick are grown in the order by MOVPE. The result of measuring the thickness of a grown film with a surface profiler shows that the thickness of a grown film immediately under the masking part 2 of a shadow mask 1 is reduced up to approximately one-fifth of that in an area opposite to the exposed area 3 and sufficiently distant from the masking part 2.

Next, after the shadow mask 1 is detached from the InP substrate 21, the p-type InP cladding layer 28 is again formed by 5 μm and next, a highly doped p-type InGaAs cap layer 29 of 0.2 μm thick is formed.

Next, the substrate is processed so that it is provided with a laser structure provided with a tapered ridge stripe wave guide as in the second embodiment. That is, only a part with a stripe patter 55 of the highly doped p-type InGaAs cap layer 29 of 0.2 μm thick is removed and a striped area surrounded by two stripe patterns 55 functions as a ridge stripe wave guide.

Next, the p-type InP cladding layer 28 is wet-etched with an aqueous solution in which hydrobromic acid and phosphoric acid are mixed, to form a groove. Thereby, the p-type InP layer 28 surrounded by stripe patterns 55 is formed into a reversed mesa (that is, the section is approximately in shape of a reversed trapezoid) ridge as shown in partial enlarged views A1 and A2 in FIG. 16C.

Next, a silicon oxide film 52 is formed on the upper face of the semiconductor multilayer film and polyimide resin 51 is coated being spun. After the polyimide resin other than that in the groove is removed by etchback, the silicon oxide film 52 formed on the upper face of the p-type InGaAs layer 29 on the reversed mesa p-type InP layer 28 is removed.

Figures 1, 16C:
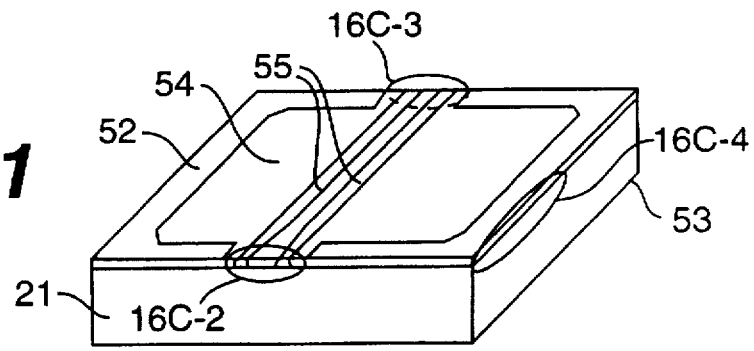
FIG. 16C is a perspective drawing showing an embodiment of a semiconductor guided-wave optical device formed thereby, and FIGS. A1, A2 and B1 are enlarged views of each part thereof.
Figures 2, 16C:
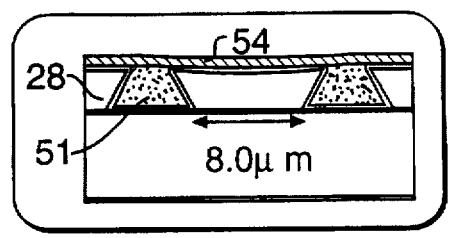
Figures 3, 16C:
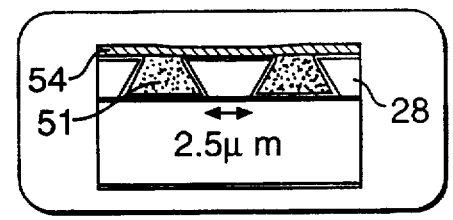
Figures 4, 16C:
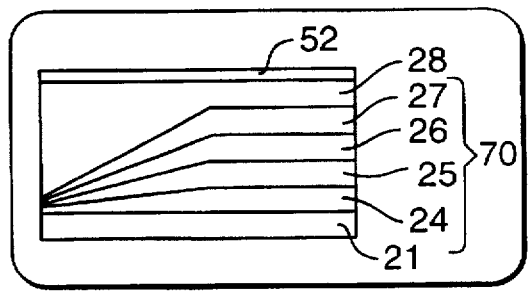

At last, after the upper electrode (a p-type electrode) 54 is formed so that it is in contact with the upper face of the p-type InFaAs layer 29 on the reversed mesa p-type InP layer 28 and the lower electrode (an n-type electrode) 53 is formed, the laser structure shown in FIG. 16C can be obtained if cut as in the second embodiment. As shown in the partial enlarged view A1, the width h of the ridge on the bottom at the laser outgoing end is expanded up to 8.0 μm in the tapered shape. The length of a tapered area in which the width of a ridge is changed by degrees is 150 μm and the length of the overall device is 500 μm. A high reflection film with a reflectance of 70% is formed on the laser rear end face. However, the thickness of an active layer on the outgoing end face is tapered toward the end face as shown in the partial enlarged view B1 in FIG. 16C.

The fabricated device shows satisfactory characteristics in that its threshold is 6 to 8 mA and its emission efficiency is 0.50 W/A measured in a state in which the device is operated at room temperature. The oscillation wavelength at room temperature is 1.3 μm. Even if the device is operated in ambient temperature of 85° C., a threshold of 18 to 22 mA and an emission efficiency of 0.40 W/A (approximately equal to those of the conventional device without a beam expander) can be obtained.

The spot diameter of a laser beam outgoing from the front end face on which the width of a ridge 8.0 μm is 7.5 μm and is expanded five times as wide as the spot diameter of a laser beam of approximately 1.5 μm outgoing from the rear end face on which the width of a ridge is 2.5 μm. This laser and a single mode fiber with a core diameter of 10 μm are coupled and the coupling loss of 2 dB or less can be realized with horizontal and vertical positioning precision of ±3 μm. When the long-term reliability of the device is evaluated at a high temperature of 90° C., an estimated life of 0.1 million hours or more is verified.

Therefore, even if the shadow mask 1 is directly loaded onto the semiconductor substrate 21 without using the wafer holder 11 and a crystalline layer is grown if the shadow mask 1 is formed into the structure in which the frame is thicker than the masking part 2, a satisfactory beam expander-integrated laser diode can be obtained as in the second embodiment.

The shadow mask 1 may be loaded onto the wafer holder as in the second embodiment, and a predetermined distance may be secured between the masking part and the upper face of the substrate to grow a crystalline layer.

<Fourth Embodiment>

Figure 8A:
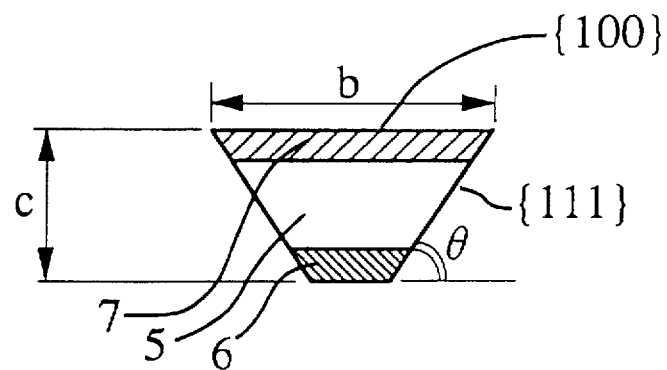
FIGS. 8A to 8C are sectional views showing respective structures of a masking part of a shadow mask.

Referring to FIG. 8A, an example in which the material constituting the surface of a shadow mask 1 is different from that in the first embodiment will be described below. FIG. 8A is a sectional view showing a masking part 2 corresponding to the masking part shown in FIG. 1B of the first embodiment.

First, a thermal oxide film 6 of 1 μm thick is formed on either surface (100) of a Si substrate 5 of 300 μm thick. This Si substrate is selectively bored to fabricate a shadow mask 1 shown in FIG. 1A. The Si substrate is bored by patterning the thermal oxide film 6 using photolithography, and then by anisotropic wet etching with a KOH aqueous solution using this patterned thermal oxide film as a mask. The sides of the masking part have {111} faces as in the first embodiment, and a sectional structure in the shape of a reversed trapezoid. An angle θ between the side and the horizontal is approximately 54 degrees.

Next, after the thermal oxide film 6 is selectively removed so that the thermal oxide film is left only on the face opposite to the semiconductor substrate when the masking part functions as a shadow mask, tungsten silicide (WSi) 7 is deposited on the surface reverse to the face on which the thermal oxide film 6 is left by sputtering. As a result, a shadow mask 1 is completed with the section of the masking part 2 mainly constituted by silicon (Si) 5 as shown in FIG. 8A. The size and shape of the shadow mask 1 are approximately equal to those in the first embodiment. A beam expander-integrated laser diode with the same structure is fabricated by the same fabricating method as in the second embodiment using this shadow mask 1 and the satisfactory characteristics can be obtained as in the second embodiment. The condition under which a crystal is grown is a little different from that in the second embodiment.

<Fifth Embodiment>

Figure 8B:
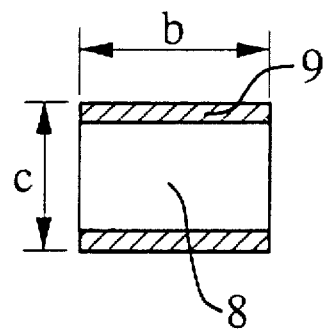

Referring to FIG. 8B, another example in which the material constituting the surface of a shadow mask 1 is different from that in the first embodiment will be described below. FIG. 8B is a sectional view showing the section of a masking part 2 corresponding to the masking part shown in FIG. 1B of the first embodiment.

First, a ceramic plate ($Al_2O_3$) 8 of 300μm thick is selectively bored by cutting or processing such as polishing to fabricate a shadow mask 1 shown in the plan in FIG. 1A. A mechanical technique such as cutting and polishing is used for processing the ceramic plate, and the ceramic plate is cleaned to remove a contamination such as metal. Next, alumina ($Al_2O_3$) 9, which is to be a thin film, is deposited on the upper and lower surfaces of this shadow mask 1 sputtering. As a result, a shadow mask 1 is completed, formed by ceramic $Al_2O_3$, the section of the masking part 2 of which is shown in FIG. 8B.

The section of the masking part 2 is formed into a rectangle as shown in FIG. 8B. This shadow mask 1 is provided with sufficient mechanical strength to be reused. A beam expander-integrated laser diode with the same structure is fabricated by the same fabricating method as in the second embodiment using this shadow mask 1, and satisfactory characteristics can be obtained as in the second embodiment. The size and conditions for growing a crystal of the shadow mask 1 are a little different from those in the second embodiment. A ceramic plate of 150 μm thick may be used; however, it is desirable in view of strength that a ceramic plate of 300 μm thick is used. Further, even if amorphous silicon (a-Si) or metal with a high melting point such as tungsten, molybdenum, tantalum and niobium is deposited in place of alumina to form a shadow mask 1, a similar effect can be obtained. A plate of metal with a high melting point such as tungsten, molybdenum, tantalum and niobium may be also used in place of the ceramic plate. A through hole through a plate made of metal with a high melting point may be formed by mechanical processing.

<Sixth Embodiment>

Figure 8C:
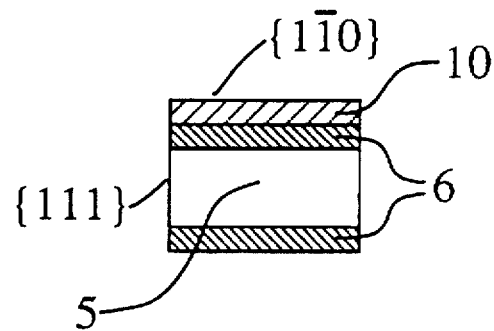

Referring to FIG. 8C, a further example in which material constituting the surface of the shadow mask 1 is different from that in the first embodiment will be described below. FIG. 8C is a sectional view showing a masking part 2 corresponding to that shown in FIG. 1B of the first embodiment.

First, a thermal oxide film of 1 μm thick is formed on the upper and lower surfaces (1~10) of a Si substrate 5 of 150 μm thick. This Si substrate is selectively bored to fabricate a shadow mask 1 shown in FIG. 1A. The Si substrate is bored, that is, a through hole is formed, by patterning the thermal oxide film 6 using photolithography and by anisotropic wet etching with a KOH aqueous solution using this pattern thermal oxide film as a mask. The sides of the mask part have the {111} faces as in the first embodiment and in this case, the structure in the shape of a rectangle, an angle between the side of which and a horizontal plane is 90 degrees, can be obtained.

Next, an undoped InP polycrystalline layer 10 of approximately 1 μm thick is formed on the thermal oxide film 6 reverse to the face opposite to the semiconductor substrate if the masking part is used as a shadow mask 1 by MOVPE. The InP polycrystalline layer 10 can be readily formed by setting the temperature for growth lower than that in a normal case, for example setting it to approximately 400° to 500° C. As a result, a shadow mask 1 mainly formed by Si 5, the section of the masking part 2 of which is constituted as shown in FIG. 8C, is completed. As the shadow mask 1 is mainly made of Si 5, sufficient mechanical strength can be obtained even if it is 150 μm thick.

A beam expander-integrated laser diode with the same structure is fabricated by the same fabricating method as in the second embodiment using this shadow mask 1 and satisfactory characteristics can be obtained as in the second embodiment. The size and the conditions for growing a crystal of the shadow mask 1 are a little different from those in the second embodiment. It need scarcely be said that the melting point of each material mainly constituted the shadow mask 1 required to be higher that the temperature required for growth of a semiconductor grown layer.

Further, a similar shadow mask 1 can be also formed using an InP substrate or a GaAs substrate in place of the Si substrate. However, as such a substrate is weak in strength, compared with the Si substrate, it is desirable that the thickness of such a substrate be 300 μm or more. For material for a patterning mask when photolithography is performed, a dielectric thin film formed by $SiO_x$ or others or photoresist can be used. For etchant for forming a through hole through an InP substrate, HBr aqueous solution or bromomethanol ($BrCH_3OH$) may be used, and, for etchant for forming a through hole a GaAs substrate, bromomethanol may be used. As a high quality crystalline grown film can be obtained even if an InP or GaAs film which is coated with nothing is formed on the surface of the shadow mask or is coated with a dielectric thin film, the shadow mask can be used for a semiconductor guided-wave optical device.

<Seventh Embodiment>

Figure 9A:
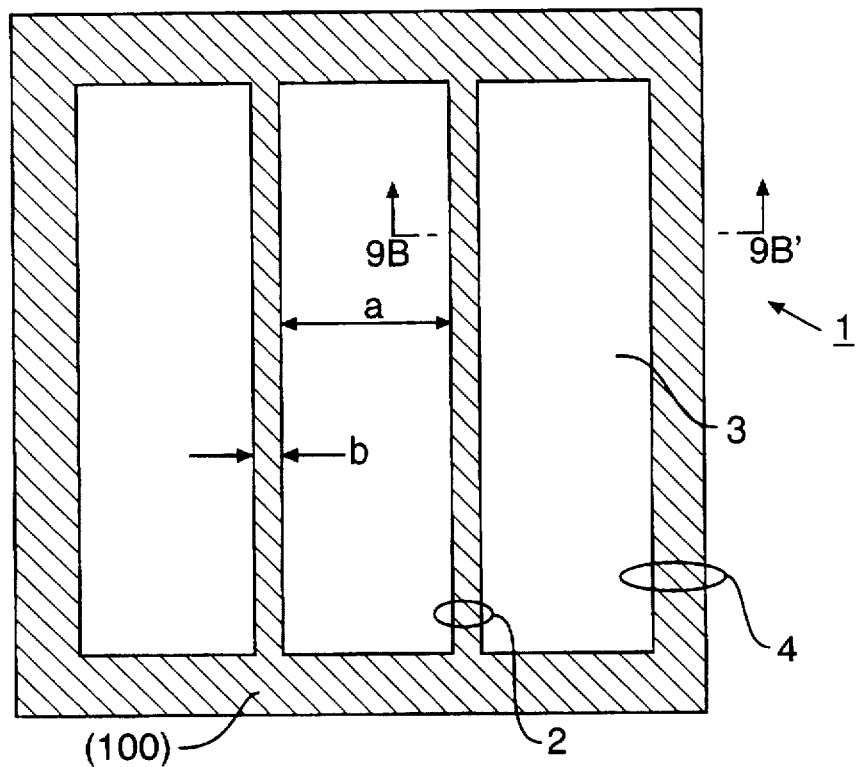
FIGS. 9A and 9B are respectively a plan and a sectional view of the main part showing another embodiment of a shadow mask.
Figure 9B:
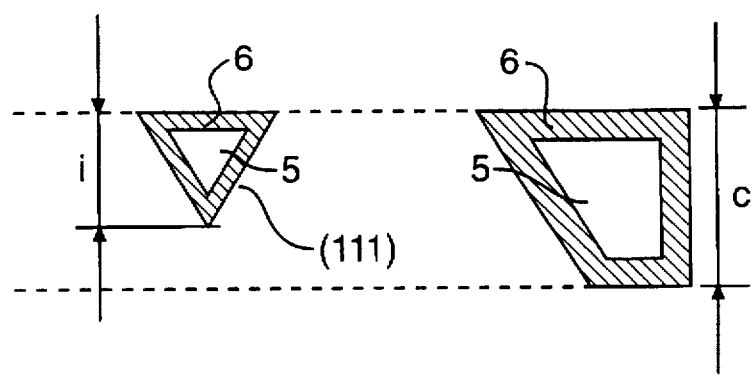

Referring to FIGS. 9A and 9B and FIGS. 14A to 14E, a shadow mask, the structure of the section of which is different from that of the first embodiment will be described below. FIG. 9A is a plan showing a shadow mask according to this embodiment and FIG. 9B is a sectional view showing a part shown by a line B–B' in FIG. 9A.

As shown by the structure of the section shown in FIG. 9B, a shadow mask 1 according to this embodiment is provided with a difference in level between a frame 4 and a masking part 2, and the thickness C of the frame 4 is larger than that i of the masking part 2. Next, a method of fabricating such a shadow mask 1 will be described below, referring to the sectional views showing the process in FIGS. 14A to 14E.

First, a thermal oxide film 6a of 1 μm thick is formed on both surfaces (100) of a Si substrate 5 of 300 μm thick. (FIG. 14A) The thermal oxide film 6a on either surface of this Si substrate is patterned in the shape shown in FIG. 9A using photolithography. That is, the thermal oxide film 6a is selectively removed. (FIG. 14B) However, at this time, a pattern for the thermal oxide film 6a in a part which is to be striped masking part 2 in the next anisotropic etching when anisotropic etching for 300 μm is performed.

Next, anisotropic etching with a KOH aqueous solution is performed using this pattern thermal oxide film 6a as a mask to bore the Si substrate 5. (FIG. 14C) As the thermal oxide film 6a is etched by side etching, the section of the part which is to the masking part 2 is in the shape of a pyramid enclosed by faces {111}. As the sufficient thermal oxide film 6a is left in a part which is to be the frame 4, it is thicker than that in a part which is to be the masking part 2 and the difference in thickness is left as a difference in level. When the thermal oxide film 6a in a part which is to be the masking part 2 is etched by side etching, a desired difference in level can be by overetching in anisotropic etching. FIG. 14C shows a case that a difference in level is provided by overetching.

Thereafter, the thermal oxide film 6a is entirely removed (FIG. 14D) and continuously, the surface of the substrate is oxidized to form a thermal oxide film 6 of 1 μm thick on the overall surface. (FIG. 14E) When the upper and lower surfaces are reversed, a shadow mask 1 with the structure of the section shown in FIG. 9B in which the thickness of the frame 4 and the masking part 2 is different can be obtained. In this embodiment, a shadow mask 1 has the thickness i of the masking part 2 that is reduced up to approximately 150 µm while the thickness c of the frame 4 is 300 µm is given as an example. For the other size of the shadow mask, the width a of an exposed area 3 is 782 µm and the width b of the masking part 2 is 218 µm. The faces oblique against the face (100) of the mask part 2 are the {111} faces.

The shadow mask 1 formed as described above is directly loaded onto the surface (100) of an n-type InP substrate 21 and a crystal is grown by MOVPE. The conditions for growth are equal to those in the second embodiment. If the shadow mask 1 is loaded onto the surface (100) of the n-type InP substrate 21, the distance between the lower surface of the masking part 2 and the upper surface of the InP substrate 21 is approximately 150 µm. A beam expander-integrated laser diode with the same structure is fabricated by the same fabricating method as in the second embodiment using this shadow mask 1 and the same satisfactory characteristics can be obtained as in the second embodiment.

<Eighth Embodiment>

A beam expander-integrated laser diode array which is integrated on the same substrate and is operated in a band of a wavelength of 1.3 µm shown in FIGS. 10A and 10B will be described below as an embodiment of a semiconductor guided-wave optical device according to the present invention.

Crystal growth on a p-type InP substrate 31 is performed using a shadow mask 1 by MOVPE as in the second embodiment. As shown in FIGS. 10A and 10B, a multilayer film is formed by depositing a p-type InGaAsp (composite wavelength: 1.10 µm) layer 27, a strained-multiple quantum well active layer 26 formed by any element which belongs to the sixth period, an n-type InGaAsp (composite wavelength: 1.10 µm) layer 25 and an n-type InP layer 24 in the order shown, on the p-type substrate 31. The strained-multiple quantum well active layer 26 is constituted by an InGaAsp (composite wavelength: 1.45 µm) well layer 41 of 6.0 nm thick with compressive strain of 1% and an InGaAsp (composite wavelength: 1.10 tm) barrier layer 42 of 10 nm thick as shown in the enlarged view in FIG. 10A. In this case, the distance between the lower surface of the shadow mask 1 and the upper surface of the p-type InP substrate 31 is approximately 200 µm. The other conditions for growth are equal to those in the second embodiment. Th e result of measuring the thickness of a film after growth tells that the thickness of a grown film constituting a core layer immediately under the center of the masking part 2 is reduced up to approximately one-third of that in an area on which the vicinity of the center of the exposed area 3 is vertically projected.

Next, the above-described grown film which is to be an active layer is etched in the shape of a mesa with wet etchant, using a silicon oxide film as a mask. At this time, the width of a mesa stripe wave guide on the side which is to be the front end face of the laser is concurrently expanded in the tapered shape.

Next, the shadow mask 1 is detached an d a current blocking layer consisting of the p-type InP layer 28, the n-type InP layer 24 and the p-type InP layer 28 is grown by MOVPE. After growth, the SiO₂ mask is removed and again, crystal growth for an n-type InP layer 24 and a highly doped n-type InGaAsp layer 32 with high density is performed in order by MOVPE.

Figures 1, 10A:
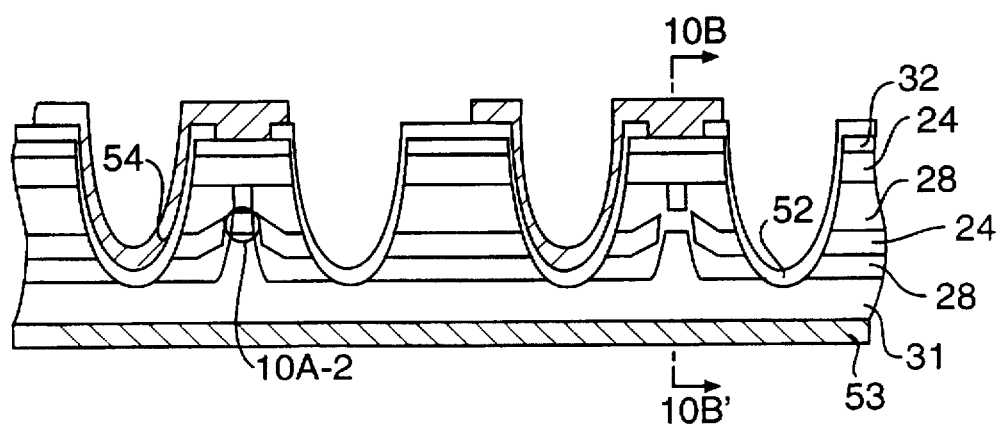
FIGS. 10A and 10B are sectional views showing an embodiment of a semiconductor guided-wave laser array formed by a fabricating method according to the present invention.
Figures 2, 10A:
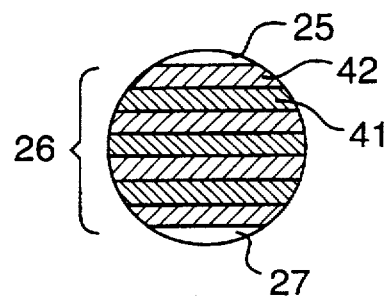
Figure 10B:
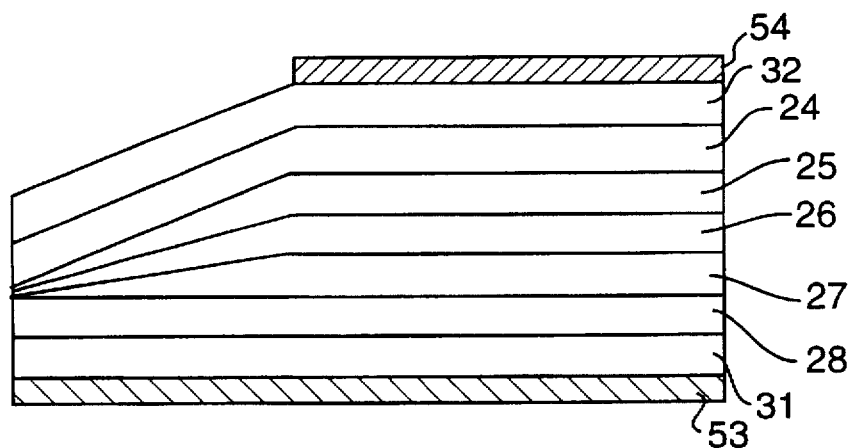

Thereafter, SiO₂ 52 is deposited by chemical vapor deposition (CVD) and when the upper electrode 54 and the lower electrode 53 are formed after a contact hole is bored in the SiO₂ 52 using photolithography, the laser array structure shown in FIG. 10A is completed. As crystal growth is performed using the shadow mask 1, a ridge stripe part is tapered in the direction of the outgoing end face of the device shown in FIG. 10B. The width of a mesa is 1.0 µm in the center of the mesa stripe wave guide far from the end face of the device. However, the width of a mesa is expanded up to 3.0 µm in the taped shape at the laser outgoing end. The length of an area in which the width of a mesa of the tapered mesa stripe wave guide is changed by degrees in 100 µm and the length of the device is 300 µm. In the same array, ten devices are formed. A reflection film with a reflectance of 70% is provided on the laser front end face and a high reflection film with a reflectance of 90% is provided. A laser diode according to this embodiment is provided with a hetero structure in which the structure for confining light in the direction perpendicular to the propagational direction of light in a wave guide is embedded.

The fabricated device shows satisfactory characteristics in that its threshold is 2 to 3 mA and its emission efficiency is 0.35 W/A when the device is continuously operated at room temperature. The oscillation wave length measured at room temperature is 1.3 µm. The threshold is 4 to 6 mA and the emission efficiency is 0.20 W/A even if the device is operated in ambient temperature of 85° C., and therefore, the characteristics equal to those of the conventional structure without a beam expander can be obtained. In the meantime, the diameter of a beam spot at the rear end where a wave guide is not tapered is approximately 1.5 µm. The spot diameter of a laser beam outgoing from the front end from which a wave guide is tapered is expanded up to 4.5 µm or approximately three times as wide as that at the rear end. This laser and a single mode fiber with a core diameter of 10 µm are coupled, and a coupling loss of 3 dB or less can be realized with horizontal and vertical positioning precision of ±3 µm. The dispersion of the characteristics among devices in the same array is equal to that of a similar laser diode array without a beam expander. The long-term reliability of the device is evaluated at a high temperature of 85° C. and its estimate life of 0.1 million hours or more is verified. For a shadow mask 1, any of the shadow masks described in the first and fourth to seventh embodiments may be used.

The width of the mesa stripe wave guide is not limited to the above-described value but the width of the wave guide in the center of the device may be practically in the range of 1 to 1.6 µm. If the width of the wave guide at the outgoing end is expanded so that it is wider by 1 to 5 µm than the width in the center, the effect of the expanding a spot can be obtained.

<Ninth Embodiment>

A semiconductor laser optical amplifier with the structure shown in FIG. 11 which is operated in a band of a wavelength of 1.55 µm will be described below as another embodiment of a semiconductor optical device according to the present invention.

Crystal growth on an n-type InP substrate 21 is performed using a shadow mask 1 by MOVPE as in the second embodiment. At this time, each film is grown on the surface of the n-type InP substrate 21 in an area on which the vicinity of the center of an exposed area 3 of the shadow mask is vertically projected so that film 5 with the following thicknesses are formed. An n-type InP layer 24 of 0.2 µm thick, an n-type InGaAsp (composite wavelength: 1.20 µm) layer 33 of 0.15 µm thick, an InGaAsp (composite wavelength: 1.55 µm) bulk active layer 34 of 0.1 µm thick, a p-type InGaAsp (composite wavelength: 1.20 µm) layer 35 of 0.05 µm thick and a p-type InP layer 28 of 0.1 µm thick are formed in the stated order. The other conditions for growth are equal to those in the second embodiment. The result of measuring the thickness of a grown film tells that the thickness of a grown film on the surface opposite to the center of a masking part 2, that is, constituting a core layer immediately under the center of the masking part 2, is reduced up to approximately one-fifth of that in an area on which the vicinity of the center of the exposed area 3 is vertically projected.

Next, after the shadow mask 1 is detached, again a p-type InP layer 28 of 5 µm thick and a highly doped p-type InGaAs layer of 2 µm thick (not shown) are formed in that order by MOVPE as in the second embodiment.

Next, the substrate formed as described above is processed by the same fabricating method as in the second embodiment so that it is provided with a laser structure provided with a tapered ridge stripe wave guide shown in the partial enlarged view B1 in FIG. 11. The width g of a ridge on the bottom is 2.5 µm as shown in the partial enlarged view A3 showing the section in the center of the device. However, the width h of the ridge on the bottom is expanded up to 7.5 µm in the tapered shape at the end of the device through/from which a laser beam is incident/outgoing end A2 is omitted because it is the same as A1. The length of a tapered area in which the width of the ridge is changed by degrees is 150 µm and the length of the device is 700 µm. An antireflection film with a reflectance of 0.05% is provided on both end faces of the device.

The fabricated device shows a satisfactory gain of 25 dB when current of 100 mA is applied, and the difference of the gain between TE and TM modes is 0.5 dB or less when the device is continuously operated at room temperature. The saturation power is 10 dBm. The diameter of a beam spot at the incident/outgoing end at which the width h of a ridge is 7.5 µm is expanded up to approximately 6 µm four times as wide as that of the conventional device. This optical amplifier and a single mode fiber with a core diameter of 10 µm are coupled and a coupling loss of 2 dB or less at either end face can be realized with horizontal and vertical positioning precision of ±3 µm. The width of a ridge is not limited to the above-described value and, if the width of a ridge is expanded by 3 to 8 µm wider at the laser beam incident/outgoing end than the width of a ridge in the range of 1.5 to 3.0 µm in the center of a wave guide, the effect of expanding a spot can be practically obtained without a problem.

<Tenth Embodiment>

A semiconductor laser optical amplifier with the structure shown in FIG. 17C which is operated in a band of a wavelength of 1.55 µm wherein a shadow mask is directly loaded onto a substrate without using a wafer holder 11 and a quantum well layer, will be described below.

Figure 17A:
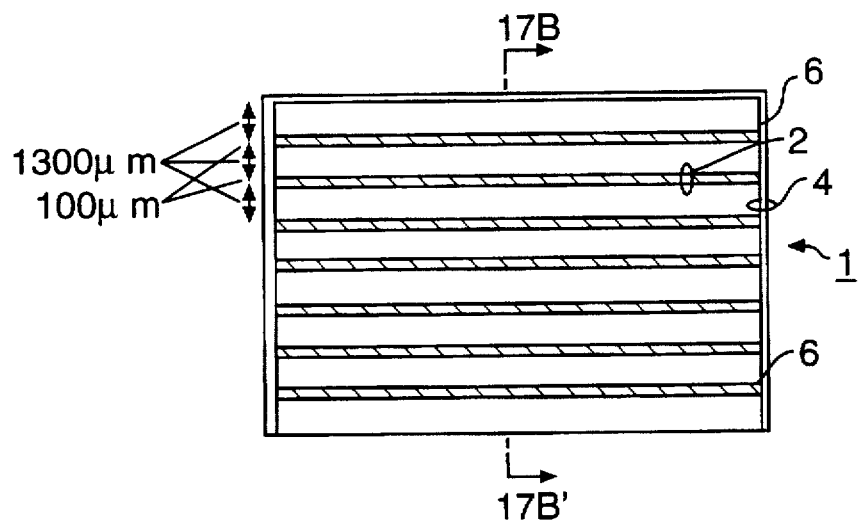
FIG. 17A is a plan view of a shadow mask.
Figure 17B:
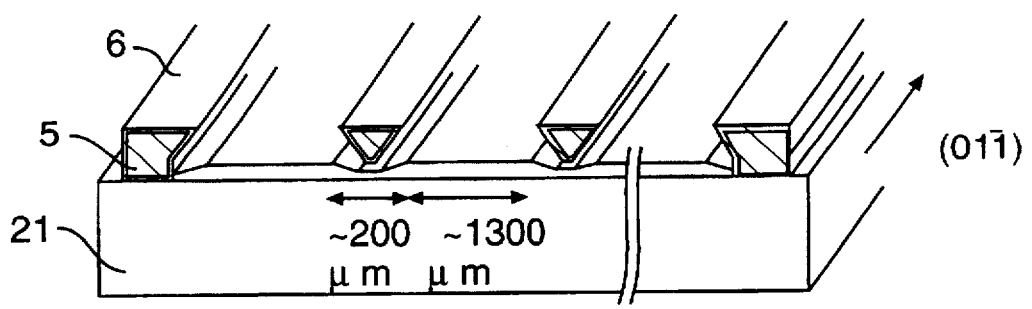
FIG. 17B is a perspective drawing of a section of the main part when a semiconductor thin film is grown using this shadow mask.

As shown in FIG. 17A, the structure of a shadow mask 1 is equal to that in the third embodiment. However, a masking part 2 and a frame 4 are coated with an oxide film 6b. In this embodiment, the width of an exposed area 3 is 1300 µm and a difference in level between the masking part 2 and the frame 4 is 0.5 µm. FIG. 17B is a perspective drawing showing the section of a part shown by a line A–A' in FIG. 17A after this shadow mask 1 is loaded onto an n-type InP semiconductor substrate 21 and a multilayer film described later is grown by MOVPE. As shown in FIG. 17B, the lower surface of the masking part 2 of the shadow mask 1 is lifted by 0.5 µm from the InP substrate 21. The shadow mask 1 is loaded so that the direction of a stripe of the masking part 2 is equivalent tot he direction [01~1] of the InP substrate 21.

After the shadow mask 1 is loaded onto the InP substrate 21 as described above, crystal growth is performed by MOVPE as follows: That is, n-type InP buffer layer 24 of 0.2 µm thick, a lower n-type InGaAsp optical guide layer (composite wavelength: 1.15 µm) 33' of 0.05 µm thick, a strained-multiple quantum well active layer 66 formed by any element which belongs to the sixth period consisting of an InGaAs (composite wavelength: 1.60 µm) well layer of 6.0 nm thick with tensile strain of 0.45% and an InGaAsp (composite wavelength: 1.15 µm) optical guide layer 35' of 0.05 µm thick and a p-type InP cladding layer 28 of 0.1 µm thick are formed in the stated order. The result of measuring the thickness of a grown layer with a surface profiler tells that, as shown in FIG. 17B, the thickness of a grown film immediately under the masking part 2 of the shadow mask 1 is reduced up to approximately one-tenth of that in an area under an exposed area 3 sufficiently distant from the masking part 2. Next, after the shadow mask 1 is detached, again a p-type InP cladding layer 28 of 5 µm thick and a highly doped p-type InGaAs cap layer 29 of 0.2 µm thick are formed in the order by MOVPE.

Figures 1, 17C:
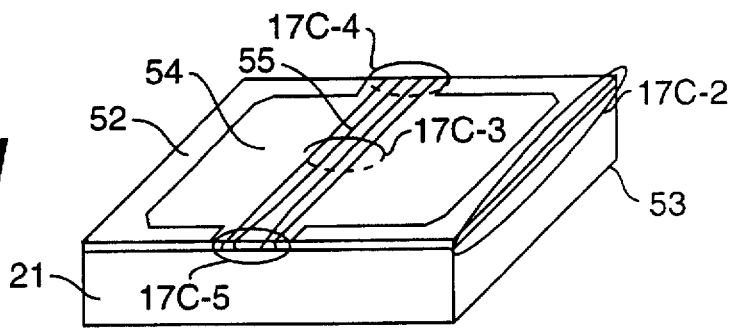
FIG. 17C is a perspective drawing showing another embodiment of a semiconductor guided-wave laser beam amplifier formed thereby, and FIGS. A1, A2, A3 and B1 are enlarged views of each part thereof.
Figures 2, 17C:
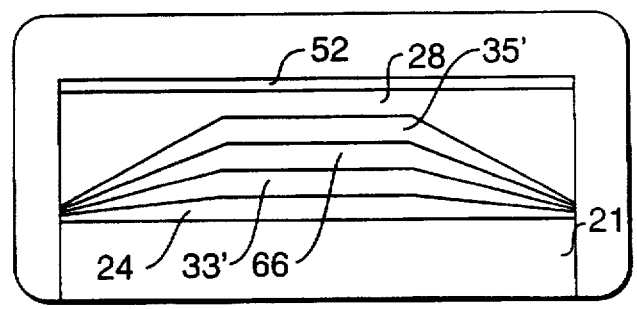
Figures 3, 17C:
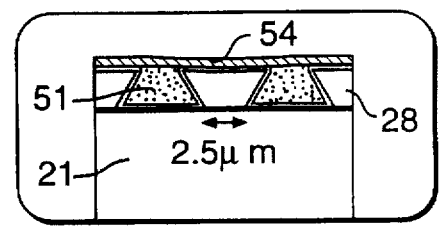
Figures 4, 17C:
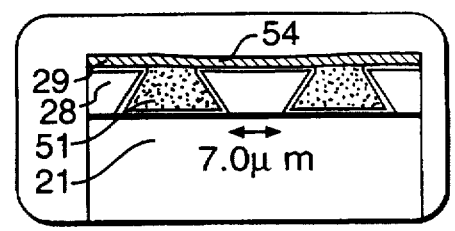

Next, the substrate formed as describe above is processed by the same fabricating method as in the second embodiment so that is provided with a laser structure having tapered ridge stripe wave guide shown in the partial enlarged view B1 FIG. 17C. The width of a ridge on the bottom is 2.5 µm as shown in the partial enlarged view B1 in FIG. 17C. The width of a ridge on the bottom is 2.5 µm as shown in the partial enlarged view A3 showing the section in the center of the device. However, it is expanded up to 7.0 µm in the tapered shaped at the laser beam incident/outgoing end as shown in the partial enlarged views A1 and A2. The length of a tapered area in which the width of a ridge is changed by degrees is 150 µm and the length of the device is 700 µm. An antireflection film with a reflectance of 0.05% is provided on both end faces of the device.

The fabricated device shows a satisfactory of 25 dB when current of 100 mA is applied and the difference of the gain is continuously operated at room temperature. The saturation power is 10 dBm.

The diameter of a beam spot at the incident/outgoing end at which the width of a ridge is 7.0 µm is expanded up to approximately 6 µm four times as wide as that of the conventional device. This optical amplifier and a single mode fiber with a core diameter of 10 µm are coupled and a coupling loss of 2 dB or less at either end face can be realized with horizontal and vertical positioning precision of ±3 µm.

<Eleventh Embodiment>

A method of fabricating a semiconductor guided-wave optical device according tot he present invention by supplying etching gas in addition to material for growth in crystal growth using a shadow mask 1 will be described below.

First, a shadow mask 1 as described in the first embodiment and shown in FIG. 1 is fabricated. Basically, crystal growth is performed by the same method and under the same conditions as those in the first embodiment. However, the distance d between the shadow mask 1 and a substrate 21 is set to 50 µm equivalent to one-third of that in the first embodiment. While a crystal is grown by MOVPE, methyl chloride ($CH_3Cl$) constituting an etching gas in addition to the carrier gas and material for growth are supplied. Further, crystal growth by MOVPE without using etching gas is also tried for comparison. The amount of supplied $CH_3Cl$ is set to the degree at which the optical crystallinity of a grown layer is not deteriorated in crystal growth to which $CH_3Cl$ is supplied without using a shadow mask 1. Each film is grown for a time appropriate to epitaxy.

Figure 12A:
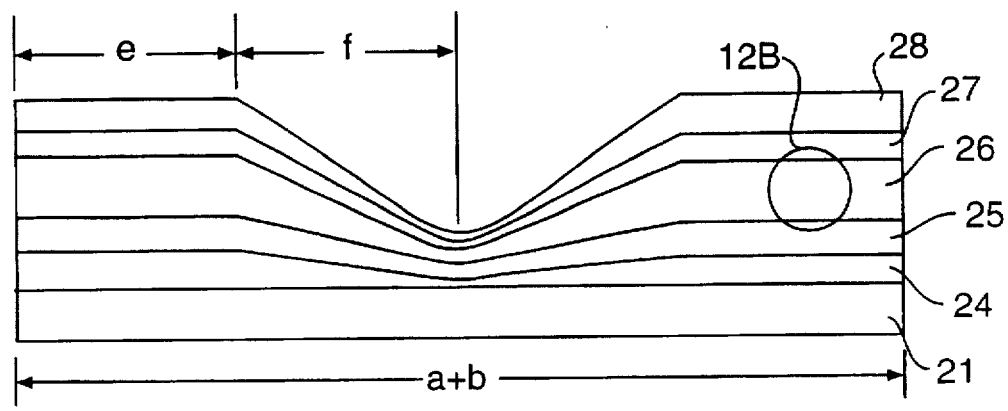
FIGS. 12A and 12C are sectional views schematically showing the difference of the form depending upon whether etching gas is used or not when a semiconductor thin film is grown using a shadow mask according to the present invention.
Figure 12B:
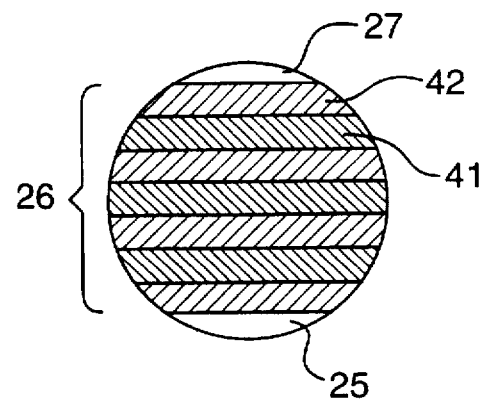
FIG. 12B is an enlarged view of a part shown in FIGS. 12 and 12C.
Figure 12C:
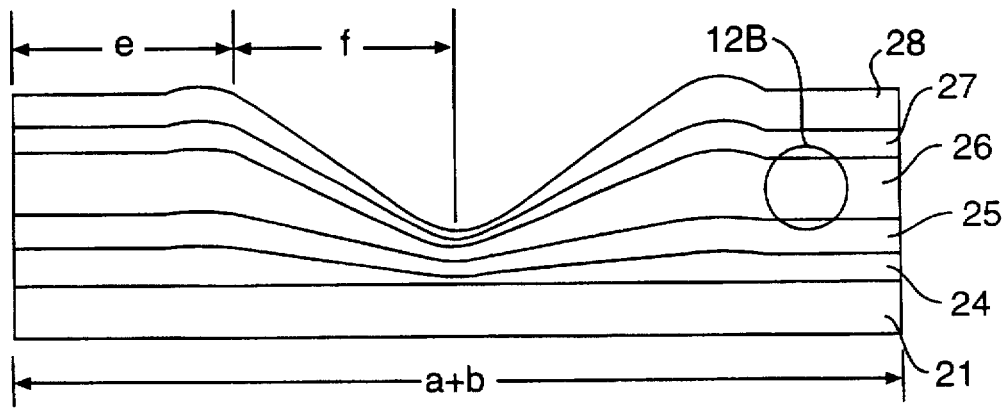

After growth, the thickness of a grown layer is measured with a contour measuring instrument and a scanning electron microscope. FIG. 12A is a sectional view showing the section of layers grown by concurrently supplying $CH_3Cl$ as an etching gas, and FIG. 12C is a sectional view showing the section of layers grown without the etching gas. Both drawings show that the thickness of a grown film constituting a core layer immediately under the center of the masking part 2 is reduces approximately one-fifth to one-seventh of that in an area e on which the vicinity of the center of the exposed area 3 is vertically projected.

Next, a beam expander-integrated laser diode with the same structure is fabricated in the same process as in the second embodiment. In the case of a grown layer shown in FIG. 12A, satisfactory characteristics equal to those of the laser diode described in the second embodiment can be obtained. In the case of a grown layer shown in FIG. 12C, characteristics equivalent to those of the laser diode described in the second embodiment, that is, characteristics practically without a problem in degree that the full width at the half maximum of a spectrum is increased by 5 nm, can be obtained. FIG. 12B is partial enlarged view showing a strained-multiple quantum well active laser 26 formed by any element which belongs to the sixth period.

Next, flatness of the thickness of a film in sectional views showing a grown layer in FIGS. 12A and 12C will be described below. While the surface in an area e in the sectional structure shown in FIG. 12A is flat, an area in which films which are not flat are increased is generated in the area e close to an area f in the sectional structure shown in FIG. 12C. This increase of the thickness of a film occurs based upon the same principle as that of the conventional selective area growth using a dielectric thin film mask. The reason why the of the thickness of a film which does not occur in the second embodiment occurs in FIG. 12C is mainly that there is a difference in the total value of the distance d and the thickness of the shadow mask 1 between the second embodiment and this embodiment. In this embodiment in which this total value is set to a small one of 200 μm in the case of FIG. 12C in which etching gas is not used, material for growth with high density is locally diffused in a vapor phase close to the masking part 2 in the direction of the surface of a substrate and it causes an increase of the speed of growth in the vicinity immediately under the masking part 2.

In the meantime, the reason why satisfactory flatness of a film can be obtained in the case of FIG. 12A in which etching gas is used together is as follows: Main family III vapor-phase diffusion material which contributes to growth is InCl and GaCl in a vapor phase over an InP substrate 21. These diffusion materials are extremely readily volatilized, compared with family III diffusion material generated in normal growth by MOVPE without using chloride gas. Therefore, they are not on the surface of a grown layer but are readily taken into a vapor phase over the substrate 21 in a process in which material for growth with high density is locally diffused in a vapor phase close to the masking part 2 in the direction of the surface of the substrate. Practically, if a chloric family III organmetallic compound is used in the conventional selective area growth using a dielectric thin film mask, it is known that the length of diffusion in a vapor phase obtained from the exponential profile of the thickness of a film is extremely short. As described above, according to a fabricating method according to this embodiment by which etching gas is concurrently supplied, in-plane film thickness distribution can be controlled and a grown layer can flattened.

For etching gas, hydrogen chloride (HCl) gas may be used in addition to $CH_3Cl$ and the same effect can be also obtained if material gas including amine or amino group is used.

<Twelfth Embodiment>

An interference optical modulator schematically shown in FIG. 18 which is operated in a band of a wavelength 1.55 μm will be described below as the other embodiment of a semiconductor guided-wave optical device according to the present invention.

For an active layer of the modulator, a multiple quantum well active layer 61 formed by any of elements which belong to the twenty-fifth period consisting of an InGaAsp (composite wavelength: 1.57 μm) well layer of 9.0 nm thick and an InAlAs (composite wavelength: 0.86 μm) barrier layer of 5 nm thick is formed. This active layer 61 is formed by MOVPE using a shadow mask 1, for the structure of the shadow mask 1, any of the shadow masks described in the first and fourth to seventh embodiments may be used.

The width of a ridge is 1.5 μm inside the modulator because of the condition of single mode. However, it is expanded up to 6.0 μm in the tapered shape at the laser beam outgoing end. The length of a tapered area in which the width of a ridge is changed by degrees is 150 μm and the length of the device is 1400 μm. An antireflection film with a reflectance of 1% is provided on both end faces of the device. The thickness of an active layer on an incident/outgoing end face is respectively tapered toward the end as shown in the partial enlarged views B1 and B2 in FIG. 18.

The diameter of a beam spot at the incident/outgoing end of a ridge 6 μm wide of the fabricated device is expanded up to approximately 5 μm which is approximately three times as wide as that of the conventional type. This optical modulator and a single mode fiber with a core diameter of 10 μm are coupled, and a coupling loss of 2 dB or less at either end face can be realized with horizontal and vertical positioning precision of ±2 μm. Therefore, the whole insertion loss of the modulator can be reduced up to 10 dB or less. The modulator shows satisfactory characteristics that its driving voltage is 3 V and its band of modulation is 17 GHz. Further, even if the position of the fiber is intentionally dislocated by ±1 μm no change occurs in the characteristics of the modulator. In FIG. 18, a reference number 21 denotes an n-type InP substrate with the surface (100), 51 denotes polyimide resin, 53 denotes the lower electrode and 54 denotes the upper electrode.

<Thirteenth Embodiment>

A high output laser shown in FIG. 19 which is oscillated at a wavelength of 1.48 μm will be described below as another embodiment of a semiconductor guided-wave optical device according to the present invention. In FIG. 19, the same reference number is allocated to the same part as a similar component shown in FIG. 6 for explaining the second embodiment.

For an active layer, a strained InGaAsp multiple quantum well structure 81 with an emission wavelength of 1.48 μm is formed. This active layer is formed by MOVPE using a shadow mask 1. For the structure of the shadow mask 1, any shadow mask described in the first and fourth to seventh embodiments may be used.

For high output and operation in the stable single transverse mode, the width of an emission area, that is, the width of a ridge is set to 2.4 μm at the incident end as shown in the partial enlarged view A2 in FIG. 19, it is set to 5 μm at the outgoing end as shown in the partial enlarged view A1, the length of a tapered area in which the width of a ridge is changed by degrees is set to 200 μm and the length of a resonator is set to 1200 μm. A low reflection film with a reflectance of 3% is formed on the front end face of the device and a high reflection film with a reflectance of 90% is formed on the rear end face. The thickness of an active layer is also tapered in the direction of the outgoing end as shown in the partial enlarged view B1.

The high output laser according to this embodiment shows characteristics that its threshold of oscillation when the device is continuously operated at room temperature is 25 to 32 mA and its emission efficiency is 0.40 to 0.43 W/A. The maximum optical output power is 350 mW. The spot diameter of a laser beam outgoing from the front rear end of a ridge with a width of 5 μm is 4.5 μm. This high output laser is integrated with a heat regulator, a lens and an optical fiber on a ceramic substrate and modularized, and the maximum module output power of 280 mW can be obtained because a low coupling loss of 1.0 dB with the fiber can be obtained. The satisfactory characteristics of optical amplification, in which noise field intensity of the device is reduced, are verified by using this device for a pump light source for an Erbium-doped fiber amplified.

<Fourteenth Embodiment>

A high output distributed feedback laser shown in FIG. 20 which is oscillated at a wavelength of 1.55 μm will be described below as yet another embodiment of a semiconductor guided-wave optical device according to the present invention. In FIG. 20, the same reference numbers are allocated to the same parts as those shown in FIG. 6 for explaining the second embodiment.

For an active layer, a strained InGaAsp multiple quantum well structured 91, the emission wavelength of which is 1.55 μm and a grating 92, the period of which is 241 nm, are formed. This active layer is formed by MOVPE using a shadow mask 1, any shadow mask described in the first and fourth to seventh embodiments may be used. The grating 92 may be formed by a well-know method such as a phase shift or double resist.

For high output and operation in the stable single transverse mode, the width of an emission area at the incident end is set to 2.4 μm as shown in the partial enlarged view A2 in FIG. 20, the width of an emission area at the outgoing end is set to 5 μm as shown in a partial enlarged view A1, the length of a tapered area in which the width of a ridge is changed by degrees is set to 150 μm and the length of a resonator is set to 600 μm. A low reflection film with a reflectance of 1% is formed on the front end face of the device and a high reflection film with a reflectance of 90% is formed on the rear end face. The thickness of an active layer is tapered in the direction of the outgoing end as shown in a partial enlarged view B1.

The characteristics of a high output distributed feedback laser according to this embodiment obtained as described above are that the threshold of oscillation when the device is continuously operated at room temperature is 15 to 18 mA and its emission efficiency is 0.35 to 0.40 W/A. A maximum optical output power of 150 mW can be obtained. The spot diameter of a laser beam outgoing from the front end of a ridge 5 μm wide is 4.5 μm. This laser is modularized as in the thirteenth embodiment and the maximum module output power of 120 mW can be obtained because a low coupling loss of 1.0 dB can be realized.

<Fifteenth Embodiment>

A high output laser diode shown in FIG. 21 which is oscillated at a wavelength 0.98 μm will be described below as another embodiment of a semiconductor guided-wave optical device according to the present invention. In FIG. 21, the same reference numbers are allocated to the same parts as the components shown in FIG. 6 for explaining the second embodiment.

First, an n-type $In_{0.51}Ga_{0.49}P$ buffer layer 102 of 2.0 μm thick and an n-type GaAs layer of 0.01 μm thick are formed in the stated order on the surface (100) of an n-type GaAs semiconductor substrate 101 by MOVPE. The above-described n-type GaAs layer of 0.01 μm thick is entirely removed with, for example, a mixed solution of sulfuric acid, hydrogen peroxide and water. Thereafter, using a shadow mask 1, a lower InGaAsP (composite wavelength: 0.70 μm) optical guide layer 104 of 0.05 μm thick, a single quantum well active layer 105 consisting of an $In_{0.17}Ga_{0.83}$ As well layer of 6.0 nm thick and an InGaAsp (composite wavelength: 0.70 μm)Optical guide layer 106 of 0.05 μm thick, a p-type $In_{0.51}Ga_{0.49}$ P cladding layer of 0.1 μm thick are formed in the order by MOVPE. For the structure of the shadow mask 1, any shadow mask described in the first and fourth to seventh embodiments may be used.

The result of measuring the thickness of a grown layer with a surface profiler tells that the thickness of a grown film immediately under a masking part 2 of the shadow mask is reduced up to approximately one-fifth of that in an area under the center of an exposed area 3 sufficiently distant from the masking part 2.

Next, the shadow mask 1 is detached and after the above-described p-type GaAs cap layer of 0.01 μm thick is removed, again a p-type $In_{0.51}Ga_{0.49}P$ cladding layer 190 of 5.0 μm thick and a highly doped p-type GaAs cap layer 110 of 0.2 μm thick are formed in the stated order by MOVPE.

Next, the substrate formed as described above is processed so that it is provided with a ridge stripe laser structure shown in FIG. 21 as in the second embodiment. In FIG. 21, reference number 51 denotes a polyimide resin, 52 denotes $SiO_2$, 53 denotes the lower electrode 54 denotes the upper electrode. For high output and operation in the stable single transverse mode, the width of an emission area at the incident end is set to 2.4 μm as shown in the partial enlarged view A2 in FIG. 21, the width of an emission area at the outgoing end is set to 5 μm as shown in partial enlarged view A1, the thickness of an active layer is tapered as shown in a partial enlarged view B1, the length of the tapered area is set to 200 μm and the length of a resonator is set to 900 μm. A low reflection film with a reflectance of 1% is formed on the front end face of the device and a high reflection film with a reflectance of 90% is formed on the rear end face.

When a high output laser diode in the range of a wavelength of 0.98 μm according to this embodiment obtained as described above is continuously operated at room temperature, the threshold of oscillation is 12 to 15 mA and its emission efficiency is 0.60 to 0.70 W/A. A maximum optical output power of 400 mW can be obtained. The spot diameter of a laser beam outgoing from the front end of a ridge 0.5 μm wide is 4.5 μm. This laser is modularized as in the thirteenth embodiment, and a maximum module output power of 320 mW can be obtained because a low coupling loss with an optical fiber of 1.0 dB can be obtained. It is know that the deterioration of the laser in a band of this wavelength caused when the device is operated at high output is caused by deterioration of crystallinity on the end face with a high optical density distribution. However, as the diameter of the beam spot can be readily expanded in this embodiment, the deterioration of crystallinity on the end face when the device is operated at high output can be greatly reduced by reduction of the optical density on the outgoing end face. Therefore, the estimated life the device exceeds a million hours.

Satisfactory characteristics of optical amplification in which the noise field intensity is reduced are verified by using this device for a pump light source for Erbium-doped fiber amplified.

The effect by which the life of the device is extended by reduction of optical density on the end face of the device enable by expanding the diameter of a beam spot can be applied to any high output laser diode with a wavelength of approximately 1 μm or shorter.

As clarified by the above-described embodiments, and according to a method of fabricating a semiconductor guide-wave optical device according to the present invention, the thickness of a semiconductor thin film can be modulated on the same surface of a substrate when a crystal is grown and the optical crystallinity can be enhanced, a ridge waveguide optical device provided with excellent high-speed characteristics wherein optical coupling with an optical fiber is easy and its operating current and operating voltage are low can be extremely easily realized.

According to a method of fabricating a semiconductor guided-wave optical device according to the present invention, a practical semiconductor tapered guided-wave optical device provided with excellent device characteristics and durable for long-term use and an integrated device can be fabricated.

Further, not only a semiconductor guided-wave optical device according to the present invention is provided with greatly enhanced performance and yield, but an optical communication system can be priced low, can be provided with a large capacity and can readily cover a long distance by applying this device.

As described above, it is disclosed in preferred embodiments according to the present invention that an allowable error in coupling efficiency and alignment between a guided-wave optical device and a fiber can be greatly improved. However, the present invention is not limited to the above-described embodiments 'but can be applied to any guided-wave optical device used by coupling with a fiber which can be fabricated by a similar method, and the design may be changed variously within the intention of the present invention.

What is claimed is:

1. A semiconductor guided-wave optical device having an input end and an output end, comprising:

a semiconductor substrate;

a first cladding layer on said semiconductor substrate;

a core layer grown by vapor-phase epitaxy on said first cladding layer; and a second cladding layer on said core layer;

wherein the thickness of said core layer is continuously and smoothly changed in a predetermined area of said device, said core layer having a higher refractive index than those of said substrate and of said first and second cladding layers; and wherein said core layer has a width that expands in said predetermined area to a maximum width at said output end of said device whereby the diameter of a beam spot at said output end is greater than that in an area of said device in which the thickness of said core layer is not changed.

2. A semiconductor guided-wave optical device according to claim 1, wherein:

the thickness of $d_0$ of said core layer at said output end and the maximum thickness $d_{max}$ of said core layer inside said optical device are related by the following inequality:

$$0 < d_0/d_{max} \leq 0.5.$$

3. A semiconductor guided-wave optical device according to claim 1, wherein:

said semiconductor guided-wave optical device is any one of a laser, an optical detector and an optical switch.

4. An integrated optical device, wherein:

plural optical devices selected from the group consisting of laser diodes, optical amplifiers, optical modulators, optical switches and optical detectors, and using the semiconductor guide-wave optical device according to claim 1 as a basic guided-wave structure are integrated on the same semiconductor substrate.

5. A semiconductor guided-wave optical device according to claim 1, wherein:

an optical waveguide is provided with two or more electrode structures for applying current or voltage; and said electrode structures are formed on the side of the surface on which said optical waveguide is formed.

6. A semiconductor guided-wave optical device according to claim 1 wherein:

an operation wavelength is 0.3 to 1.7 μm.

7. A semiconductor guided-wave optical device according to claim 1, wherein said core layer is grown by loading a shadow mask comprising a masking part, an exposed area, and a frame for supporting said masking part at a distance from said first cladding layer;

wherein said predetermined area of said core layer is thinner at least at a portion of said core layer that is opposed to a center portion of said masking part of said shadow mask, compared with a portion of said core layer that is opposed to a center portion of said exposed area of said shadow mask.

8. A semiconductor guided-wave optical device, comprising:

a structure for confining light in a direction perpendicular to a direction in which light is propagated in a waveguide thereof, said structure consisting of an embedded hetero structure;

wherein the width of said waveguide is tapered in said device;

wherein the width of said waveguide at the center of said waveguide of said device is 1 to 1.6 μm;

wherein the width of said waveguide at least one of the beam incident and outgoing ends of said waveguide is wider by 0 to 5 μm than the width at the center of said waveguide and wherein the thickness of said waveguide at the end that is wider than the center of said waveguide is thinner than the center of said waveguide.

9. A semiconductor guided-wave optical device according to claim 8, wherein the width of said waveguide at both the beam incident and outgoing ends is wider than the width at the center of said waveguide.

10. A semiconductor guided-wave optical device according to claim 8, wherein:

the relationship between the thickness of $d_0$ of a core layer at the incident or outgoing end of a beam and the maximum thickness $d_{max}$ of said core layer inside said optical device is represented by the following inequality:

$$0 < d_0/d_{max} \leq 0.5.$$

11. A semiconductor guided-wave optical device, comprising :

a structure for confining light in a direction perpendicular to a direction in which light is propagated in a waveguide thereof, said structure consisting of a ridge waveguide structure;

wherein the width of said waveguide is tapered in said device;

wherein the width of said waveguide in the center of said waveguide of said device is 1.5 to 3.0 µm; and wherein the width of said waveguide at least one of the beam incident and outgoing ends said waveguide beam is wider by 3 to 8 µm than the width at the center of said waveguide.

12. A semiconductor guided-wave optical device according to claim 11, wherein:

a side wall on both sides of a ridge is a crystal plane (111) or (01$\bar{1}$).

13. A semiconductor guided-wave optical device according to claim 11, wherein the width of said waveguide at both the beam incident and outgoing ends is wider than the width at the center of said waveguide.

14. A semiconductor guided-wave optical device according to claim 11; wherein:

the relationship between the thickness of $d_0$ of a core layer at the incident or outgoing end of a beam and the maximum thickness $d_{max}$ of said core layer inside said optical device is represented by the following inequality:

$$0 < d_0/d_{max} \leq 0.5.$$

15. A semiconductor guided-wave optical device, comprising:

a semiconductor substrate;

a first cladding layer on said semiconductor substrate;

a waveguide core layer;

a second cladding layer on said waveguide core layer;

wherein said waveguide core layer is formed of a material having a higher refractive index than at least those of said semiconductor substrate and of said first and second cladding layers;

wherein the thickness of said waveguide core layer is through said waveguide core layer thinner in the direction of beam incident and outgoing ends of said waveguide core layer than the width at the center of said waveguide core layer; and wherein the width of said waveguide is expanded at beam incident and outgoing ends of said waveguide core layer, compared with the width of the waveguide core layer at a center thereof.

* * * * *

UNITED STATES PATENT AND TRADEMARK OFFICE
CERTIFICATE OF CORRECTION

PATENT NO. : 5,764,842
DATED : June 9, 1998
INVENTOR(S) : M. AOKI et al

It is certified that error appears in the above-indentified patent and that said Letters Patent is hereby corrected as shown below:

Column 2, line 67, change "referring" to --Referring--.

Column 3, line 61, change "the other" to --another--.

Column 4, line 6, change "The other" to --Another--;
    line 39, after "than" insert --the--; and
    line 59, change "he" to --the--.

Column 5, line 51, after "plan" insert --view--;
    line 53, after "invention;" begin a new paragraph with --Fig. 2A is a sectional view showing a state in which a shadow mask is loaded onto a wafer holder over a semiconductor substrate, and Fig. 2B is an enlarged sectional view showing three types of structures of a masking part of a shadow mask;--;
    line 66, change "5A and 5B are respectively a" to --5A-1 and 5A-2 are--, and change "drawing" to --drawings--; and
    line 67, change "part and a" to --part, and Fig. 5B is a--.

Figure 18A:
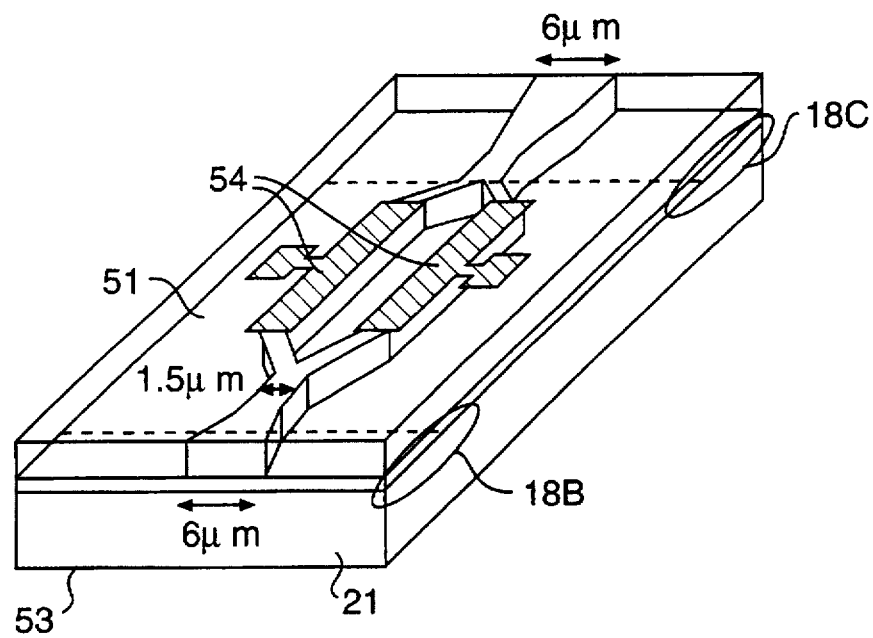
FIG. 18 is a perspective drawing showing an embodiment of an interferometric optical modulator formed by a fabricating method according to the present invention.
Figure 18B:
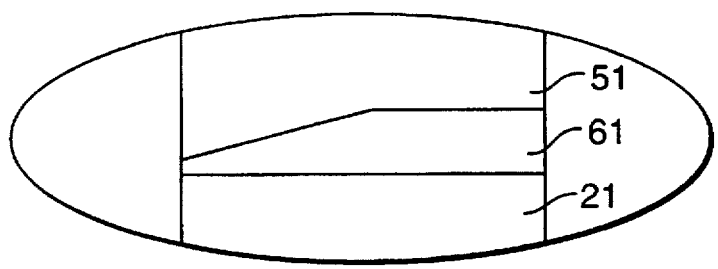
Figure 18C:
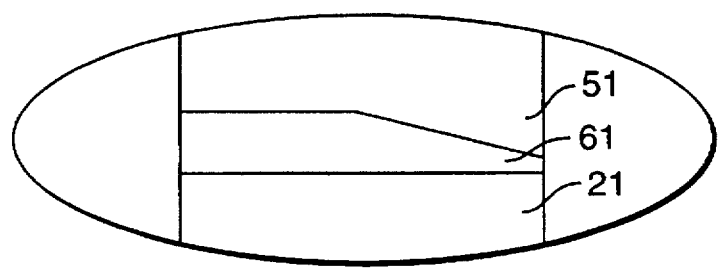

Column 6, line 4, change "6" to --6A--;
    line 7, change "A1, A2 and B1" to --6B, 6C and 6D--;
    line 10, after "output" insert --power of a semiconductor guided-wave optical--;
    line 16, after "plan" insert --view--;
    line 20, change "10A" to --10A-1, 10A-2--;
    line 24, change "11" to --11A--;
    line 27, change "A1, A3 and B1" to --11B, 11C and 11D--;
    line 48, change "16C" to --16C-1--;
    line 50, change "A1, A2 and B1" to --16C-2, 16C-3 and 16C-4--;
    line 55, change "17C" to --17C-1--;
    line 57, change "A1, A2, A3 and B1" to --17C-2, 17C-3, 17C-4 and 17C-5--;
    line 59, change "Fig. 18 is a" to --Figs. 18A-18C are--;

UNITED STATES PATENT AND TRADEMARK OFFICE
CERTIFICATE OF CORRECTION

PATENT NO. : 5,764,842  
DATED : June 9, 1998  
INVENTOR(S) : M. AOKI et al

Page 2 of 7

It is certified that error appears in the above-indentified patent and that said Letters Patent is hereby corrected as shown below:

```
     line 62, change "19" to --19A--;
     line 64, change "A1, A2 and B1" to --19B, 19C and 19D--; and
     line 66, change "20" to --20A--.

Column 7, line 2, change "A1, A2 and B1" to --20B, 20C and 20D--;
     line 4, change "21" to --21A--;
     line 7, change "A1, A2 and B1" to --21B, 21C and 21D--;
     line 29, change "A-A'" to --1B-1B'--;
     line 59, change "when" to --When--;
     line 61, after "equal" insert --as--; and
     line 67, change "an" to --another--.

Column 8, line 24, after "2" insert --is vertically projected, that is, in
an area of the InP substrate 21 opposite to the masking part 2,--;
     line 27, change "obtained, this" to --obtained.  This--; and
     line 33, change "y" to --by--.

Column 9, line 27, change "layer," to --layer.--; and
     line 28, change "alternatively" to --Alternatively--.

Column 10, line 21, change "therefore" to --Therefore--;
     line 28, change "relatively" to --Relatively--; and
     line 34, change ":" to --;--.

Column 11, line 1, change "are" to --area--;
     line 15, change "ram" to --frame--;
     line 18, after "using" insert --in--;
     line 25, change "the" to --that-- (second occurrence);
     line 30, change " [01-1] to --(011)--;
     line 31, after "21" insert --are--;
     line 48, change "showing a part shown in Fig. 5A" to --of Fig. 5A-2--;
     line 52, change "Fig. 5A," to --Figs. 5A-1 and 5A-2,--; and
     line 57, change "Fig. 5A," to --Figs. 5A-1 and 5A-2,--.
```

UNITED STATES PATENT AND TRADEMARK OFFICE
CERTIFICATE OF CORRECTION

PATENT NO. : 5,764,842
DATED : June 9, 1998
INVENTOR(S) : M. AOKI et al.

Figure 6A:
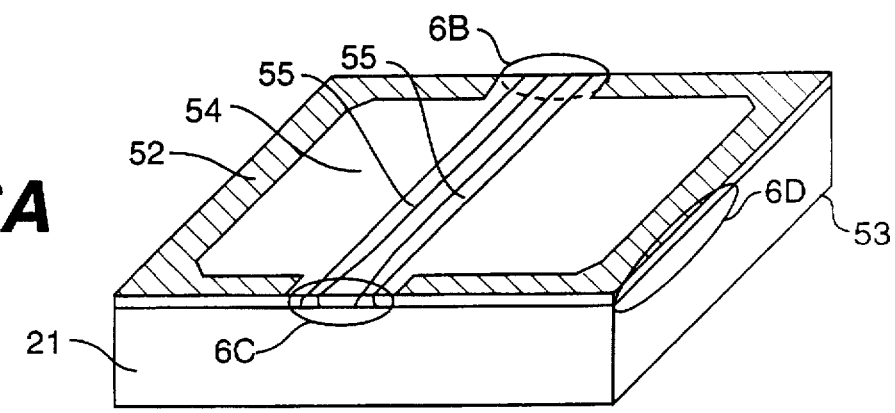
FIG. 6 is a perspective drawing showing an embodiment of a semiconductor guided-wave optical device formed by a fabricating method according to the present invention, and FIGS. A1, A2 and B1 are enlarged views of each part thereof.
Figure 6B:
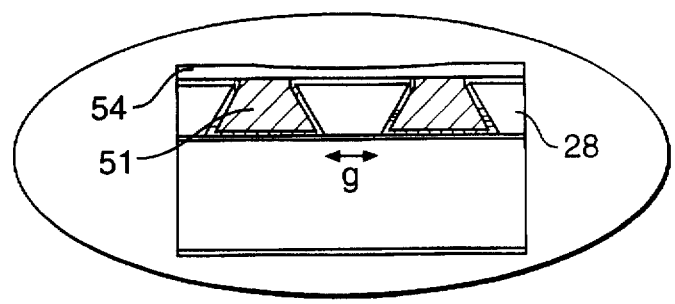
Figure 6C:
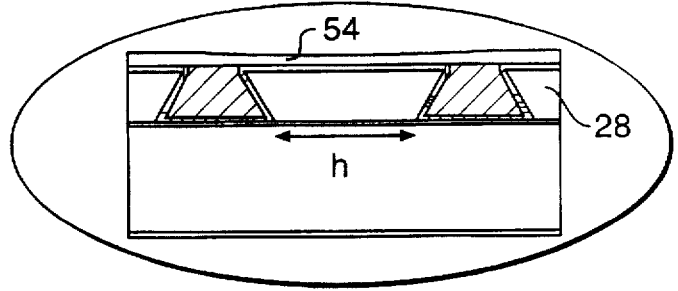
Figure 6D:
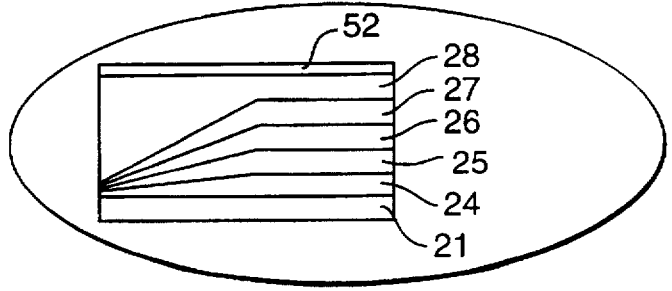

It is certified that error appears in the above-indentified patent and that said Letters Patent is hereby corrected as shown below:

Column 12, line 3, change "strip" to --stripe--;
    line 17, after "in" insert --the-- and change "A1 and" to --of Figs. 6B and 6C and--;
    line 18, delete the line in its entirety and replace with --in Fig. 6A--;
    line 37, change "A2 in Fig. 6" to --of Fig. 6B--;
    line 38, change "A1 in Fig. 6" to --of Fig. 6C--;
    line 42, change "over" to --overall--;
    line 45, change "B1 in 6" to --of-- and change "6" to --6D--; and
    line 62, change "font" to --front--.

Column 13, line 5, change "are" to --area--;
    line 10, after "is" insert --a--;
    line 15, delete the line in its entirety and insert --cladding layer, and a reference character "j" denotes the--;
    line 31, delete "fabricated" (second occurrence);
    line 34, change "provided" to --providing--; and
    line 58, change "modulate" to --modulated--.

Column 14, line 17, change "vido" to --video--;
    line 27, after "formed" insert --by--; and
    line 30, after "equal" insert --to--.

Column 15, line 3, after "1" insert --,-- and after "6" delete ",";
    line 6, after "However," insert --for--;
    line 11, change "[01-1] to (011)--;
    line 22, after "the" insert --stated--;
    line 36, change "patter" to --pattern--;
    line 55, change "InFaAs" to --InGaAs--;
    line 57, change "16C" to --16C-1--;
    line 58, delete "the" (second occurrence);
    line 59, change "partial enlarged view A1," to --in Fig. 16C-3, the width g of a ridge on the bottom is 2.5 um. However, as shown in Fig. 16C-2,--;
    line 67, change "B1 in Fig. 16C." to --of Fig. 16C-4.--.

UNITED STATES PATENT AND TRADEMARK OFFICE
CERTIFICATE OF CORRECTION

PATENT NO. : 5,764,842
DATED : June 9, 1998
INVENTOR(S) : M. AOKI et al

It is certified that error appears in the above-indentified patent and that said Letters Patent is hereby corrected as shown below:

Column 16, line 11, after "ridge" insert --is--; and
    line 22, after "grown" insert --,--.

Column 17, line 7, after "plan" insert --view--;
    line 12, after "1" insert --by--;
    line 43, change "(1-10)" to --(110)--; and
    line 49, change "pattern" to --patterned--.

Column 18, line 6, change "constituted" to --constituting--;
    line 7, before "required" insert --described in the fourth to sixth embodiments is-- and change "that" to --than--;
    line 19, after "hole" insert --through--;
    line 28, after "embodiment" insert --,--;
    line 29, after "plan" insert --view--;
    line 31, change "B-B'" to --9B-9B'--;
    line 46, after "be" insert --the--;
    line 47, after "etching" insert --process is equivalent to the width etched by side etching--;
    line 50, change "pattern" to --patterned--;
    line 53, after "to" insert --be--;
    line 54, delete "the"; and
    line 60, after "be" insert --obtained--.

Column 19, line 6, change "size" to --sizes--;
    line 25, change "10A" to --10A-1, 10A-2--; and
    line 31, change "10A" to --10A-1, 10A-2--.

Column 20, line 3, change "10A" to --10A-1--;
    line 9, change "taped" to --tapered--;
    line 11, change "in" to --is--;
    line 49, delete "the" (third occurrence);
    line 53, change "Fig. 11" to --Figs. 11A-11D--; and
    line 62, change "film 5" to --films--.

UNITED STATES PATENT AND TRADEMARK OFFICE
CERTIFICATE OF CORRECTION

PATENT NO. : 5,764,842
DATED : June 9, 1998
INVENTOR(S) : M. AOKI et al

Page 5 of 7

Figure 11A:
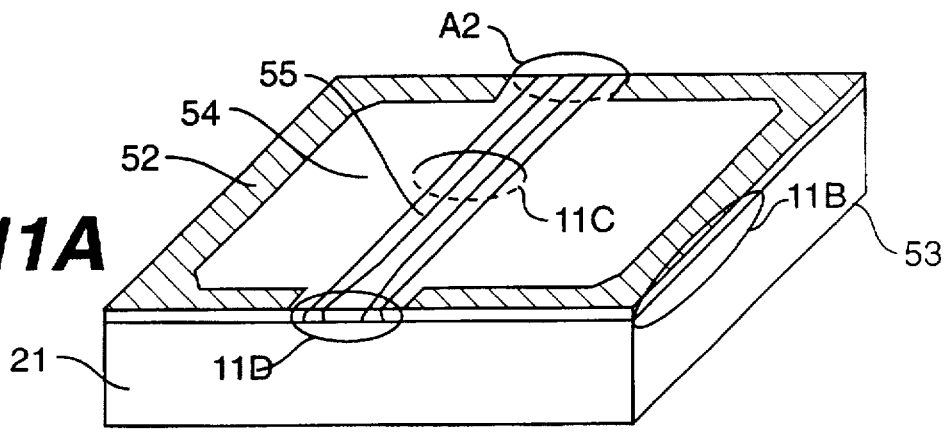
FIG. 11 is a perspective drawing showing an embodiment of a semiconductor guided-wave laser beam amplifier formed by a fabricating method according to the present invention, and FIGS. A1, A3 and B1 are enlarged views of each part thereof.
Figure 11B:
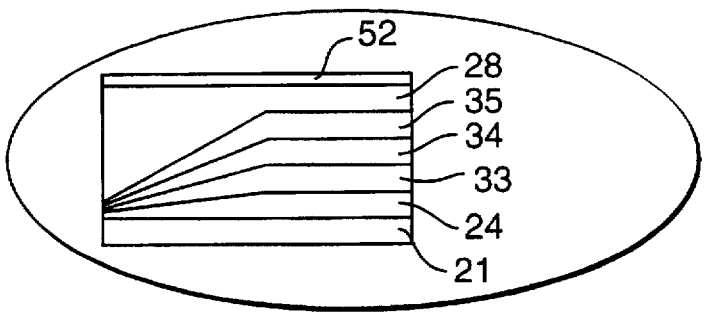
Figure 11C:
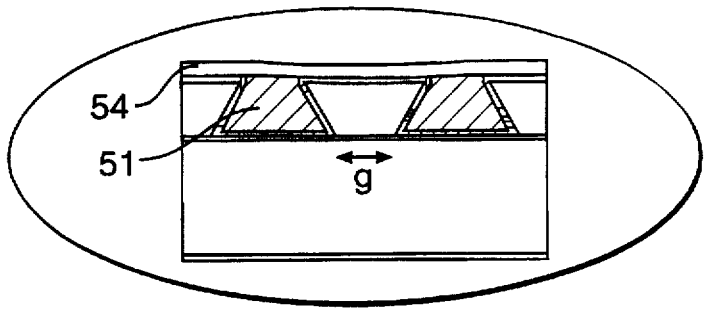
Figure 11D:
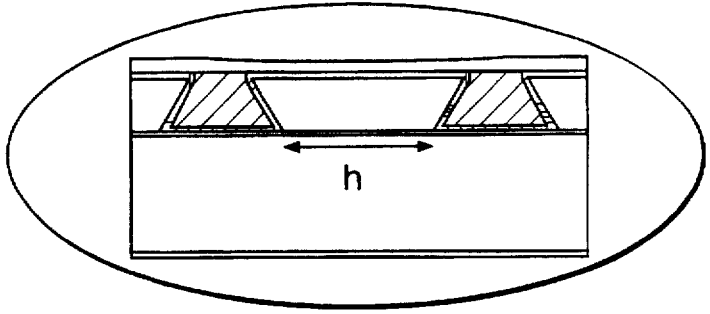

It is certified that error appears in the above-indentified patent and that said Letters Patent is hereby corrected as shown below:

Column 21, line 18, change "B1 in Fig. 11." to --of Fig. 11B.--;
    line 20, change "A3" to --of Fig. 11C--;
    line 23, after "is" insert --incident or outgoing as shown in the partial enlarged view of Fig. 11D. The partial enlarged view showing the other--; and
    line 65, change "tot he" to --to the--, and change "(01-1)" to --(011)--.

Figures 5, 17C:
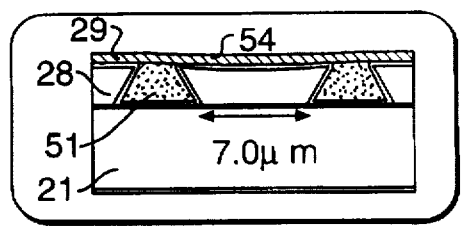

Column 22, line 1, after "is," insert --an--;
    line 8, before "optical" insert --barrier layer of 10 nm thick, an upper InGaAsP (composite wavelength: 1.15 um)--;
    line 18, after "the" insert --stated--;
    line 21, after "that" insert --it-- and after "having" insert --a--;
    line 22, after "shown" insert --in Fig. 17C-1 and--;
    line 23, change "B1 Fig. 17C" to --of Fig. 17C-2--;
    line 24, delete "the partial enlarged view B1 in Fig. 17C. The";
    line 25, delete the line in its entirety and replace with --the--;
    line 26, change "A3" to --of Fig. 17C-3--;
    line 29, change "A1 and A2" to --of Figs. 17C-4 and 17C-5--;
    line 34, after "satisfactory" insert --gain--;
    line 35, after "gain" insert --between TE and TM modes is 0.5 dB or less when the device--; and
    line 48, change "tot he" to --to the--.

Column 23, line 7, change "reduces" to --reduced--;
    line 19, after "is" insert --a--;
    line 31, delete "of the";
    line 44, change "Main" to --The main--; and
    line 55, change "organmetallic" to --organometallic--.

UNITED STATES PATENT AND TRADEMARK OFFICE
CERTIFICATE OF CORRECTION

PATENT NO. : 5,764,842
DATED : June 9, 1998
INVENTOR(S) : M. AOKI et al

Figure 19A:
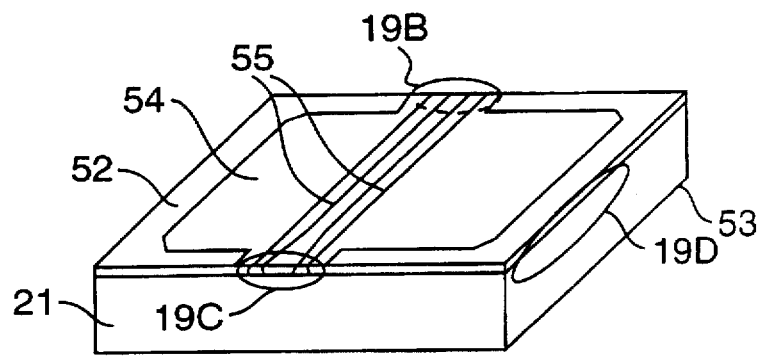
FIG. 19 is a perspective drawing showing an embodiment of a high output laser formed by a fabricating method according to the present invention, and FIGS. A1, A2 and B1 are enlarged views of each part thereof.
Figure 19B:
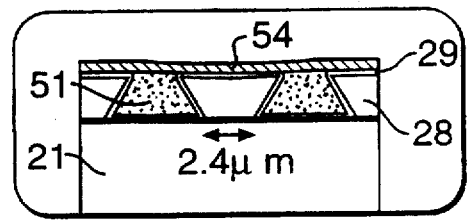
Figure 19C:
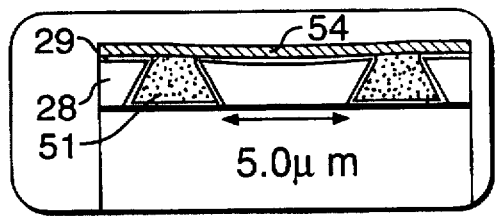

It is certified that error appears in the above-indentified patent and that said Letters Patent is hereby corrected as shown below:

Column 24, line 3, change "Fig. 18" to --Figs. 18A-18C--;
    line 4, change "the other" to --another--;
    line 13, change "for" to --For--;
    line 25, change "B1 and B2 in Fig. 18" to --of Figs. 18B and 18C--;
    line 39, change "Fig. 18" to --Figs. 18A-18C--;
    line 44, change "Fig. 19" to --Figs. 19A-19D--;
    line 60, change "A2 in Fig. 19" to --of Fig. 19B--; and
    line 61, change "A1" to --of Fig. 19C--.

Figure 19D:
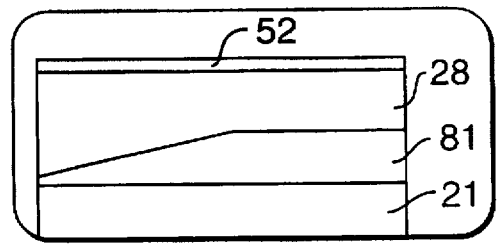
Figure 20A:
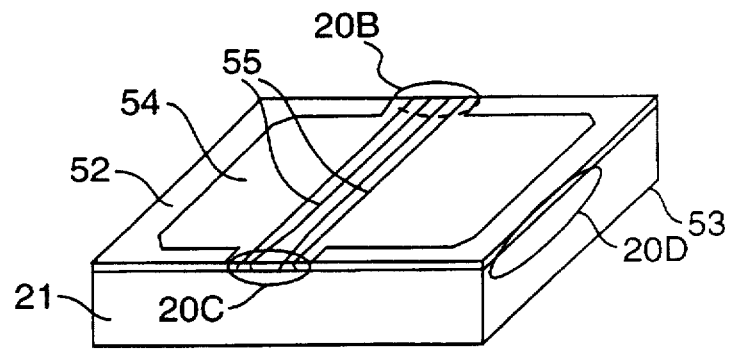
FIG. 20 is a perspective drawing showing an embodiment of a high output distributed feedback laser formed by a fabricating method according to the present invention, and FIGS. A1, A2 and B1 are enlarged views of each part thereof.
Figure 20B:
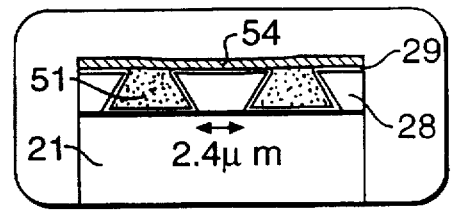
Figure 20C:
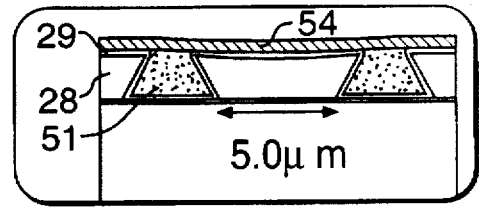
Figure 20D:
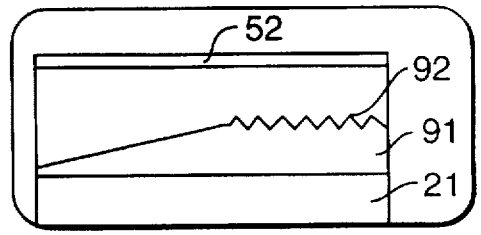

Column 25, line 2, change "B1" to --of Fig. 19D--;
    line 17, change "amplified" to --amplifier--;
    line 19, change "Fig. 20" to --Figs. 20A-20D--;
    line 27, change "structured" to --structure--;
    line 30, before "mask" (first occurrence) insert --mask 1. For the structure of the shadow mask 1,--;
    line 32, change "well-know" to --well-known--;
    line 36, delete "A2 in";
    line 37, change "Fig. 20" to --of Fig. 20B--;
    line 38, change "A1" to --of Fig. 20C--;
    line 46, change "B1" to --of Fig. 20D--; and
    line 59, change "Fig. 21" to --Figs. 21A-21D--.

Figure 21A:
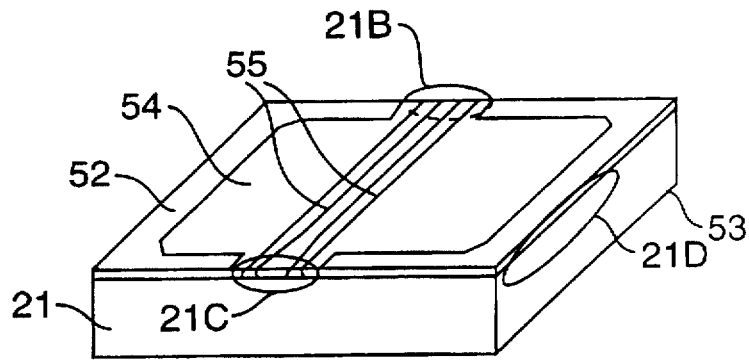
FIG. 21 is a perspective drawing showing another embodiment of a high output laser diode formed by a fabricating method according to the present invention, and FIGS. A1, A2 and B1 are enlarged views of each part thereof.
Figure 21B:
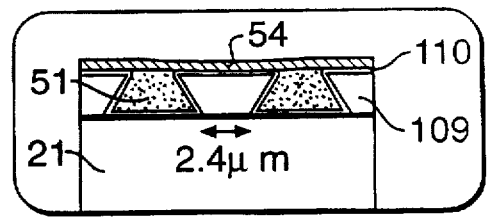
Figure 21C:
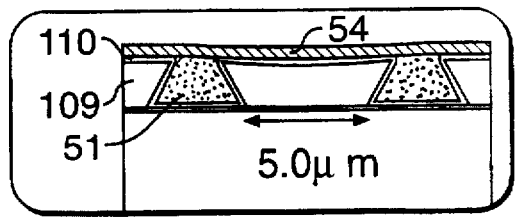

Column 26, line 9, change "an" to --an InGaAsP (composite wavelength: 0.70 um) barrier layer of 8 nm thick, an upper--;
    line 10, change "um)Optical" to --um) optical--;
    line 11, change "$In_{0.51}Ga_{0.49}P$" to --$In_{0.51}Ga_{0.49}P$--, and after "thick" insert --and a p-type GaAs cap layer of 0.01 um thick--;
    line 12, after "the" (first occurrence) insert --stated--;
    line 22, change "190" to --109--;
    line 29, after "electrode" insert --and--;
    line 33, change "A2 in Fig. 21" to --of Fig. 21B--;
    line 35, change "A1" to --of Fig. 21C--;

UNITED STATES PATENT AND TRADEMARK OFFICE
CERTIFICATE OF CORRECTION

PATENT NO.  : 5,764,842
DATED       : June 9, 1998
INVENTOR(S) : M. AOKI et al

Figure 21D:
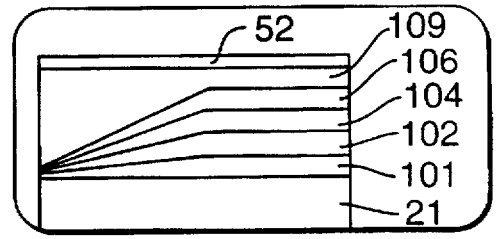

It is certified that error appears in the above-indentified patent and that said Letters Patent is hereby corrected as shown below:

COLUMN 26 continued:

line 36, change "B1" to --of Fig. 21D--;
   line 52, change "know" to --known--;
   line 60, after "life" insert --of--;
   line 64, after "for" (second occurrence) insert --an--; and
   line 65, change "amplified" to --amplifier--.

Column 27, line 1, change "enable" to --enabled--;
   line 29, after "can" insert --be--; and
   line 31, change "embodiments'" to --embodiments,--.

IN THE CLAIMS

Column 30, claim 15, line 14, delete "through said waveguide core layer".

Signed and Sealed this

Eighth Day of September, 1998

*Attest:*

BRUCE LEHMAN

*Attesting Officer*     Commissioner of Patents and Trademarks